United States Patent
Kim et al.

(10) Patent No.: US 10,536,127 B2
(45) Date of Patent: Jan. 14, 2020

(54) SIGNAL CHANNEL FOR REDUCING CROSSTALK NOISE, MODULE SUBSTRATE AND MEMORY MODULE INCLUDING THE SAME

(71) Applicant: SAMSUNG ELECTRONICS CO., LTD., Suwon-si, Gyeonggi-do (KR)

(72) Inventors: Dong-Yeop Kim, Hwaseong-si (KR); Jae-Jun Lee, Seongnam-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 61 days.

(21) Appl. No.: 15/720,326

(22) Filed: Sep. 29, 2017

(65) Prior Publication Data
US 2018/0123548 A1  May 3, 2018

(30) Foreign Application Priority Data

Nov. 1, 2016 (KR) .................. 10-2016-0144654

(51) Int. Cl.
| | |
|---|---|
| *H03H 7/38* | (2006.01) |
| *H01P 3/08* | (2006.01) |
| *G11C 7/10* | (2006.01) |
| *H05K 1/02* | (2006.01) |
| *G11C 19/14* | (2006.01) |
| *G11C 5/06* | (2006.01) |
| *H01P 3/02* | (2006.01) |
| *H01P 5/18* | (2006.01) |
| *G11C 5/04* | (2006.01) |

(52) U.S. Cl.
CPC .............. *H03H 7/38* (2013.01); *G11C 5/063* (2013.01); *G11C 7/10* (2013.01); *G11C 19/14* (2013.01); *H01P 3/02* (2013.01); *H01P 3/081* (2013.01); *H01P 5/187* (2013.01); *H05K 1/0243* (2013.01); *G11C 5/04* (2013.01); *H05K 2201/09236* (2013.01); *H05K 2201/10159* (2013.01)

(58) Field of Classification Search
USPC ........................................................ 716/115
See application file for complete search history.

(56) References Cited

U.S. PATENT DOCUMENTS

| | | |
|---|---|---|
| 6,142,830 A | 11/2000 | Loeffler |
| 6,198,688 B1 | 3/2001 | Choi |
| 6,658,530 B1 | 12/2003 | Robertson et al. |

(Continued)

*Primary Examiner* — Bryce M Aisaka
(74) *Attorney, Agent, or Firm* — F. Chau & Associates, LLC

(57) ABSTRACT

A signal channel includes at least one first signal line positioned in a first signal layer and at least one second signal line positioned in a second signal layer. The first signal layer extends in a first horizontal direction. The second signal layer extends along a second horizontal plane parallel to the first horizontal plane and spaced apart from the first horizontal plane along a vertical direction orthogonal to the first and second horizontal planes. The first signal line includes a first coupling segment and the second signal line includes a second coupling segment. The first coupling segment at least partially overlaps the second coupling segment along the vertical direction. The first and second coupling segments are positioned to form a greater degree of capacitive coupling between the first and second coupling segments than a degree of capacitive coupling formed between other segments of the first and second signal lines.

16 Claims, 25 Drawing Sheets

(56) References Cited

U.S. PATENT DOCUMENTS

| | | | |
|---|---|---|---|
| 6,854,030 B2 | 2/2005 | Perino et al. | |
| 7,864,605 B2 | 1/2011 | Lee et al. | |
| 7,903,499 B2 | 3/2011 | Kim et al. | |
| 9,166,650 B2 | 10/2015 | Wilson et al. | |
| 9,240,621 B2 | 1/2016 | Abbott et al. | |
| 2009/0124054 A1* | 5/2009 | Liu | G11C 16/0416 438/257 |
| 2013/0194055 A1* | 8/2013 | Mitake | H01P 5/184 333/116 |
| 2015/0085458 A1 | 3/2015 | Enriquez Shibayama et al. | |

\* cited by examiner

SIGNAL CHANNEL FOR REDUCING CROSSTALK NOISE, MODULE SUBSTRATE AND MEMORY MODULE INCLUDING THE SAME

CROSS-REFERENCE TO RELATED APPLICATION

This U.S. Non-provisional application claims priority under 35 USC § 119 to Korean Patent Application No. 10-2016-0144654, filed on Nov. 1, 2016, in the Korean intellectual Property Office (KIPO), the disclosure of which is incorporated by reference herein in its entirety.

TECHNICAL FIELD

Exemplary embodiments of the present inventive concept relate to semiconductor integrated circuits, and more particularly to a signal channel for reducing crosstalk noise, a module substrate and a memory module including the signal channel.

DISCUSSION OF RELATED ART

Crosstalk noise is a phenomenon that may occur due to electromagnetic coupling between signal lines carrying current flow in a signal channel. The crosstalk noise may cause timing jitter during high-speed signal transfer and thus may limit signal transfer speed. A distance between signal lines may be increased or a guard trace acting as an electromagnetic shield may be used to reduce crosstalk noise in a signal channel. However, this may increase the physical size of the signal channel. Active circuits such as an equalizer may compensate for skews in the signal channel to a certain extent; however, the effect of the equalizer may be reduced as the speed increases in the operation of semiconductor integrated circuits including the signal channel.

SUMMARY

An exemplary embodiment of the present inventive concept provides a signal channel for reducing crosstalk noise.

An exemplary embodiment of the present inventive concept provides a module substrate including a signal channel for reducing crosstalk noise.

An exemplary embodiment of the present inventive concept provides a memory module including a signal channel for reducing crosstalk noise.

According to an exemplary embodiment of the present inventive concept, a signal channel includes at least one first signal line positioned in a first signal layer and at least one second signal line positioned in a second signal layer. The first signal layer extends in a first horizontal plane. The second signal layer extends along a second horizontal plane parallel to the first horizontal plane and spaced apart from the first horizontal plane along a vertical direction orthogonal to the first and second horizontal planes. The first signal line includes a first coupling segment and the second signal line includes a second coupling segment. The first coupling segment at least partially overlaps the second coupling segment along the vertical direction. The first and second coupling segments are positioned to form a greater degree of capacitive coupling between the first and second coupling segments than a degree of capacitive coupling formed between other segments of the first and second signal lines.

According to an exemplary embodiment of the present inventive concept, a module substrate includes a substrate body including a dielectric material, a first reference plate formed in a first voltage layer in the substrate body, a second reference plate formed in a second voltage layer in the substrate body. The second voltage layer is spaced apart from the first voltage layer in a vertical direction. A plurality of signal lines are formed in a plurality of signal layers that are spaced apart between the first voltage layer and second voltage layer in the vertical direction. Each of signal lines is extended in an extending direction. Each of the signal lines includes a coupling segment such that two coupling segments of two signal lines are overlapped with each other in the vertical direction to form a capacitive coupling.

According to an exemplary embodiment of the present inventive concept, a memory module includes a plurality of memory chips and a module substrate. The memory chips are mounted on a surface of the module substrate. The module substrate interfaces communication between the memory chips and an external controller. The module substrate includes a substrate body including a dielectric material. A first reference plate is positioned in a first voltage layer in the substrate body. A second reference plate is positioned in a second voltage layer in the substrate body. The second voltage layer is spaced apart from the first voltage layer in a vertical direction and a plurality of signal lines formed in a plurality of signal layers that are spaced apart between the first voltage layer and second voltage layer in the vertical direction. Each of signal lines is extended in an extending direction. Each of the signal lines includes a coupling segment such that two coupling segments of two signal lines formed in different signal layers positioned in different planes spaced apart from each other in the vertical direction are overlapped with each other in the vertical direction to form a capacitive coupling.

The signal channel and the module substrate according to an exemplary embodiment of the present inventive concept may reduce the crosstalk noise without increase of occupation area by generating capacitive coupling between signal lines in the vertical direction and may increase operation speeds of devices and systems including the signal channel and/or the module substrate.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

Figure 1:
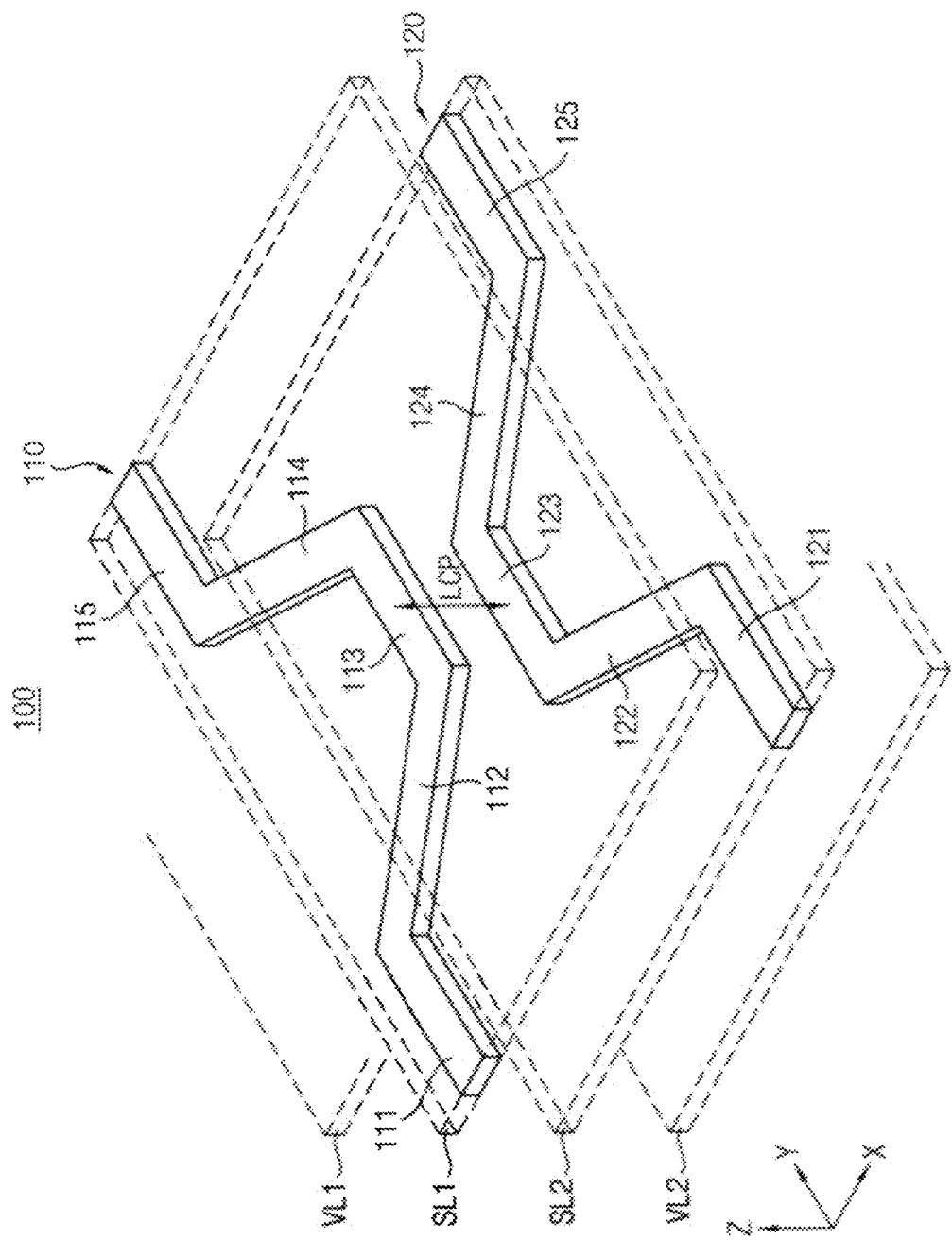
FIG. 1 is a perspective view of a signal channel according to an exemplary embodiment of the present inventive concept.

Exemplary embodiments of the present inventive concept will be described below in more detail with reference to the accompanying drawings. In this regard, the exemplary embodiments may have different forms and should not be construed as being limited to the exemplary embodiments of the present inventive concept described herein. Like reference numerals may refer to like elements throughout the specification and drawings.

A signal channel according to an exemplary embodiment of the present inventive concept may include a desired number of signal lines. Example embodiments of a signal channel including two neighboring signal lines are described with reference to FIGS. 1 through 3B and example embodiments of a signal channel including three neighboring signal lines are described with reference to FIGS. 8A through 9C; however, exemplary embodiments of the present inventive concept are not limited thereto.

Figure 2A:
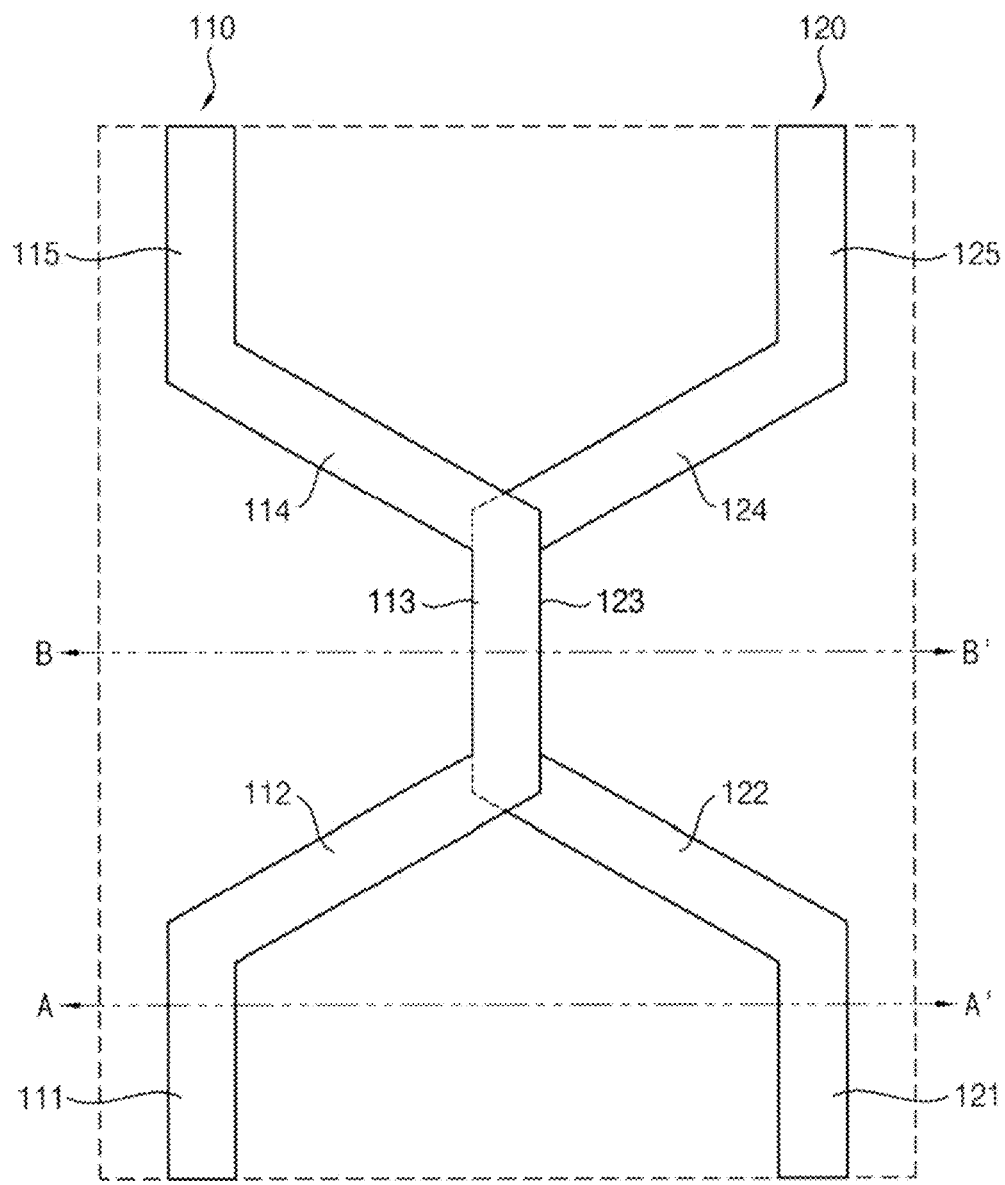
FIGS. 2A, 2B and 2C are plan views of the signal channel of FIG. 1.
Figure 2B:
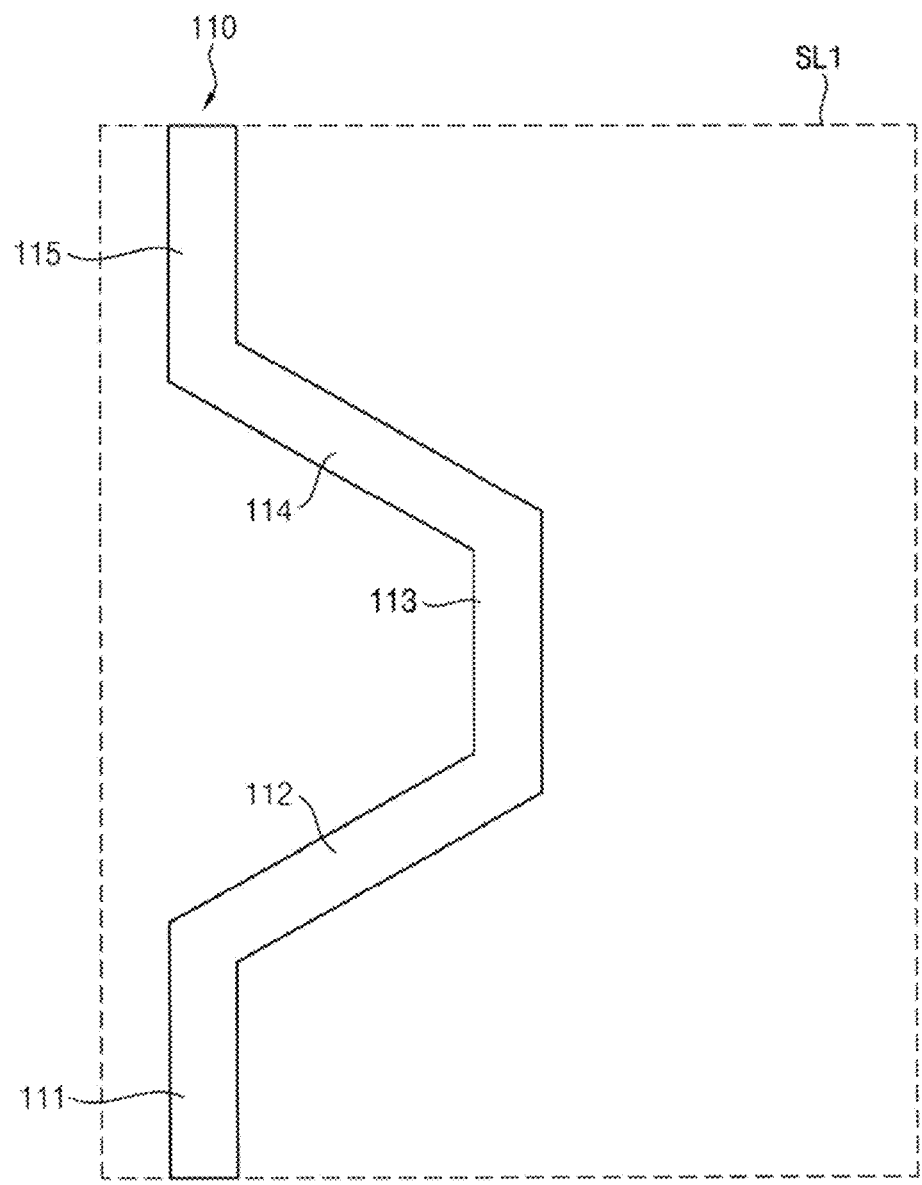
Figure 2C:
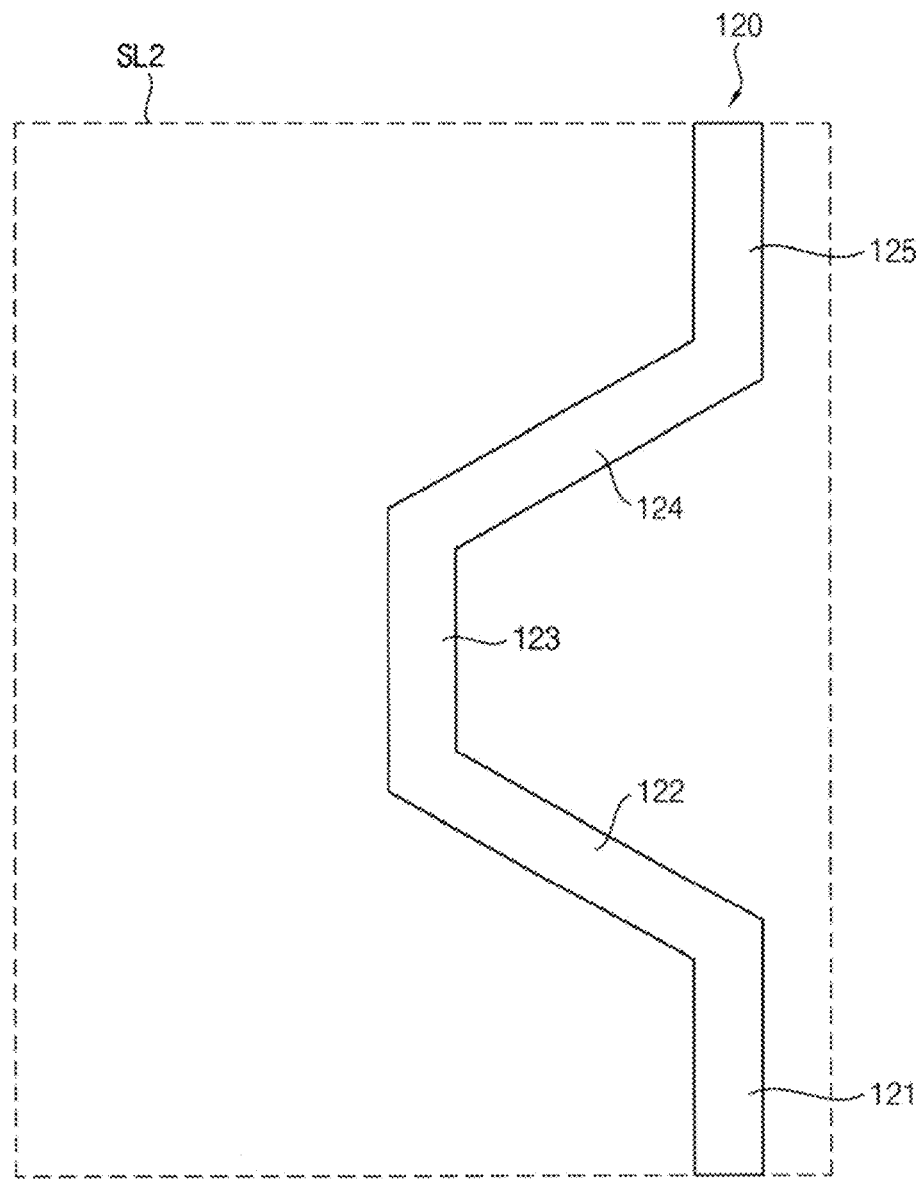
Figure 3A:
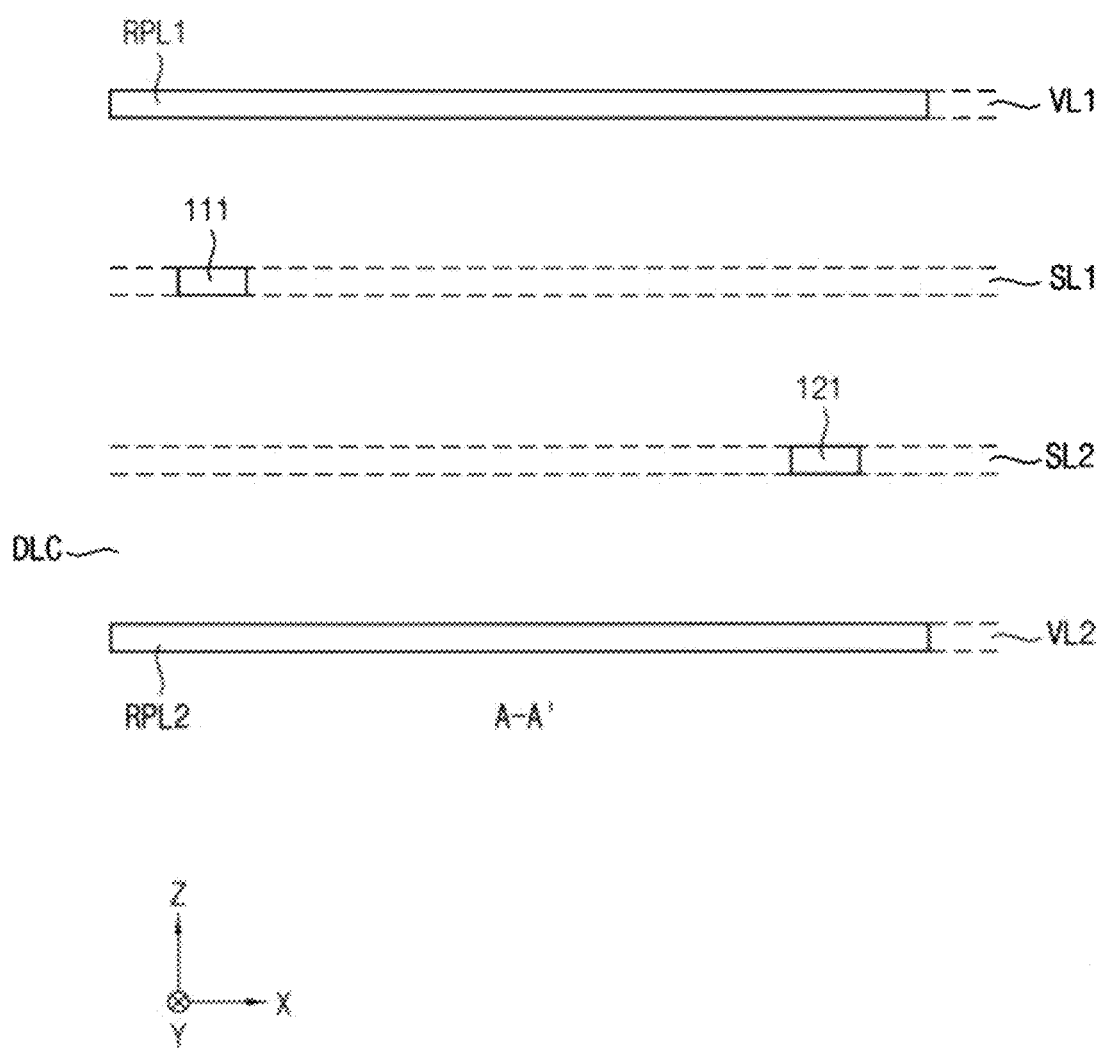
FIGS. 3A and 3B are cross-sectional views of the signal channel of FIG. 1.
Figure 3B:
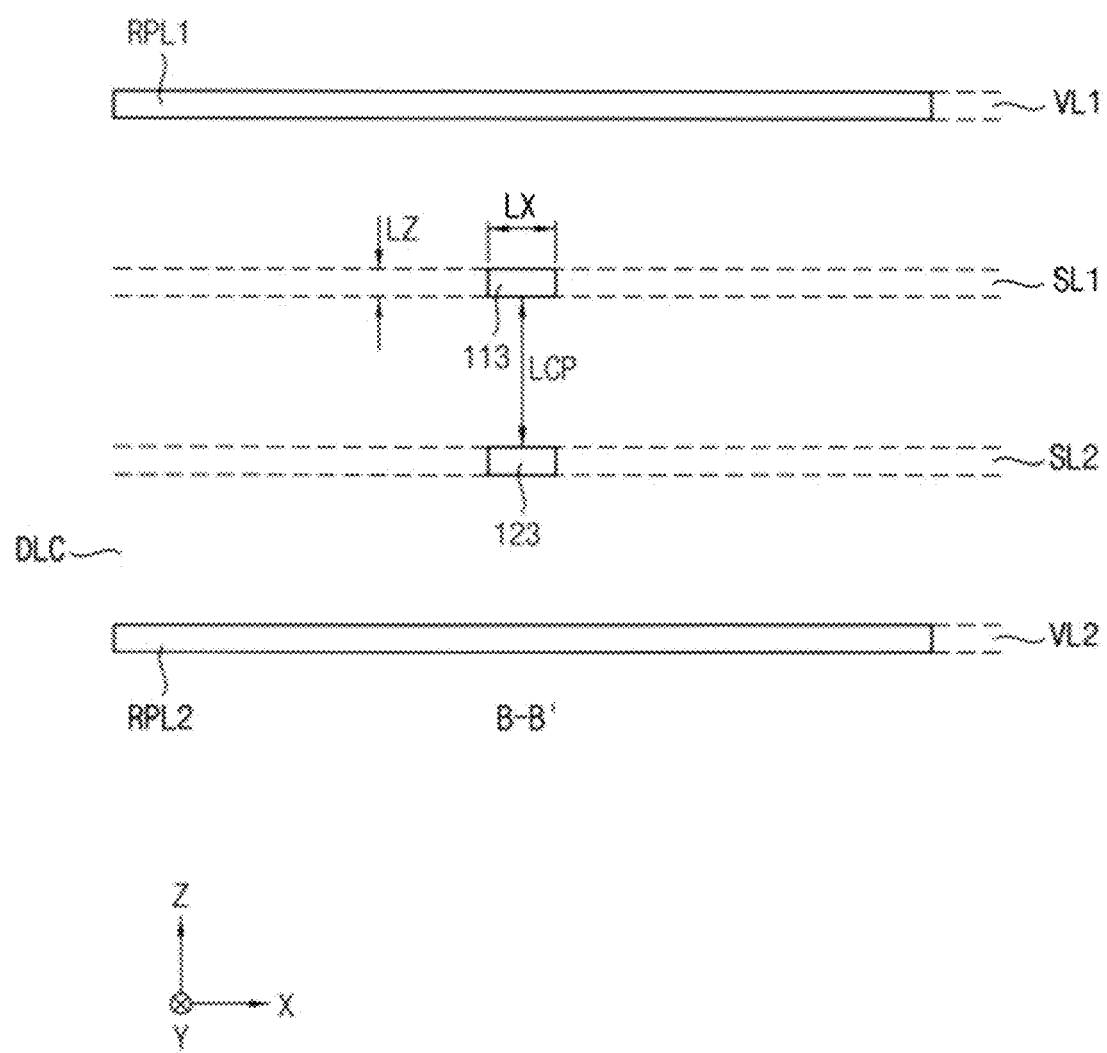

FIG. 1 is a perspective view of a signal channel according to an exemplary embodiment of the present inventive concept. FIGS. 2A, 2B and 2C are plan views of the signal channel of FIG. 1. FIGS. 3A and 3B are cross-sectional views of the signal channel of FIG. 1.

FIG. 2A is a plan view of a first signal line 110 and a second signal line 120. FIG. 2B is a plan view of the first signal line 110. FIG. 3B is a plan view of the second signal line 120. FIG. 3A is a cross-sectional view of the signal channel along a line A-A' in FIG. 2A and FIG. 3B is a cross-sectional view of the signal channel along a line B-B' in FIG. 2.A.

Referring to FIGS. 1, 2A, 2B, 3A and 3B, a signal channel 100 may include the first signal line 110 and the second signal line 120 that are extended in a column direction Y. The signal channel 100 may further include a first reference plate RPL1 and a second reference plate RPL2.

The first signal line 110 may be positioned in a first signal layer SL1 and the second signal line 120 may be positioned in a second signal layer SL2. The second signal layer SL2 may be spaced apart from the first signal layer SL1 in a vertical direction Z. The first signal line 110 and the second signal line 120 may be adjacent to each other in a row direction X perpendicular to the column direction Y. The first signal line 110 and the second signal line 120 may be capacitively coupled to each other in the vertical direction Z.

The term "segment" may refer to a portion of a signal line (e.g., not an entire signal line) herein. Segments of a signal line may be connected sequentially to each other to form one signal line.

The first signal line 110 may include first non-coupling segments 111 and 115, a first coupling segment 113 and first connecting segments 112 and 114. The first non-coupling segments 111 and 115 and the first coupling segment 113 may be extended in the column direction Y. For example, the first non-coupling segments 111 and 115 and the first coupling segment 113 may have a shape of a straight line substantially parallel to the column direction Y.

The first coupling segment 113 may be relatively closer to the second signal line 120 in comparison with the first non-coupling segments 111 and 115. Thus, the first coupling segment 113 may be capacitively coupled with the second signal line 120.

The first connecting segments 112 and 114 may connect the first coupling segment 113 to the first non-coupling segments 111 and 115. The first connecting segments 112 and 114 may be extended in a diagonal direction with respect to the column direction Y.

The second signal line 120 may include second non-coupling segments 121 and 125, a second coupling segment 123 and second connecting segments 122 and 124. The second non-coupling segments 121 and 125 and the second coupling segment 123 may be extended in the column direction Y. For example, the second non-coupling segments 121 and 125 and the second coupling segment 123 may have a shape of a straight line substantially parallel to the column direction Y.

The second coupling segment 125 may be relatively closer to the first signal line 110 in comparison with the second non-coupling segments 121 and 123. Thus, the second coupling segment 123 may be capacitively coupled with the first signal line 110. For example, the first coupling segment 113 may be capacitively coupled with the second coupling segment 123.

The second connecting segments 122 and 124 may connect the second coupling segment 123 to the second non-coupling segments 121 and 125. The second connecting segments 122 and 124 may be extended in a diagonal direction with respect to the column direction Y.

Referring to FIGS. 1, 2A, 2B, 3A and 3B, the first coupling segment 113 and the second coupling segment 123 may be positioned along the row direction X such that the first coupling segment 113 and the second coupling segment 123 are overlapped with each other in the vertical direction Z to form the capacitive coupling. The first coupling segment 113 may be moved to the right in comparison with the first non-coupling segments 111 and 115, the second coupling segment 123 is moved to the left in comparison with the second non-coupling segments 121 and 125, and thus the first coupling segment 113 and the second coupling segment 123 positioned in the different signal layers SL1 and SL2, respectively, may be overlapped in the vertical direction Z (e.g., when they are viewed from above).

A distance LCP between the first coupling segment 113 and the second coupling segment 123 may be small enough to allow a mutual capacitance between the first coupling segment 113 and the second coupling segment 123 so that the capacitive coupling may be generated or formed between the first signal line 110 and the second signal line 120.

In general, signal lines may be spaced apart from each other as far as possible under given design margin to reduce mutual interference between the signal lines. According to an exemplary embodiment of the present inventive concept, signal lines may be shaped and positioned so that only portions of the signal lines are positioned relatively close to each other to reduce crosstalk noise, as discussed below in more detail. A thickness and width, for example, a thickness LZ in the vertical direction Z and a width LX in the row direction X of the signal line and the distance LCP between the coupling segments 113 and 123 are illustrated in FIG. 3B. As an example, the thickness LZ of the signal line may be smaller than the width LX of the signal line. For example, the thickness LZ of the signal line may be from about 10 um (micrometer) to about 30 um and the width LX of the signal line may be about 100 um. The capacitive coupling in the vertical direction Z may be relatively strong because the mutual capacitance between two conductors may be increased as the opposing area is increased and the distance is decreased. For example, relatively closely spaced and relatively wide signal lines may form relatively strong capacitive coupling with each other.

The crosstalk noise due to inductive coupling applied from outside of the signal channel 100 may be reduced or eliminated by the capacitive coupling of the coupling segments 113 and 123. For example, crosstalk noise may be partially canceled, but not completely eliminated. Crosstalk noise will be discussed in more detail below with reference to FIG. 5.

The crosstalk noise may be varied depending on transfer characteristic of a system and thus the magnitude of the mutual capacitance of the coupling segments 113 and 123 for reducing the crosstalk noise may be varied, as desired. The dimensions e.g., (the width LX and the thickness LZ) of the coupling segments 113 and 123 may be determined by the size of the signal line. The distance LCP between the coupling segments 113 and 123 may be determined according to the distance between the signal layers SL1 and SL2. Thus, a mutual capacitance of the capacitive coupling may be adjusted depending on a length in the column direction Y of the two coupling segments 113 and 123 forming the capacitive coupling.

Thus, the signal channel 100 according to an exemplary embodiment of the present inventive concept may reduce crosstalk noise without increasing an occupation area by generating capacitive coupling between signal lines in the vertical direction Z. Thus, operation speeds of devices and systems including the signal channel 100 may be increased.

Referring to FIGS. 3A and 3B, the signal channel 100 may include the first reference plate RPL1 formed in a first voltage layer VL1 over the signal layers SL1 and SL2 and the second reference plate RPL2 formed in a second voltage layer VL2 below the signal layers SL1 and SL2. As an example, the signal channel 100 may have a micro-strip line structure.

The first reference plate RPL1 and the second reference plate RPL2 may each include a metal to which a reference voltage is applied, and a space between the first reference plate RPL1 and the second reference plate RPL2 may be substantially filled with an intermediate dielectric DLC. The reference voltage applied to the first reference plate RPL1 and the second reference plate RPL2 may be a ground voltage.

Referring to FIG. 3B, the first reference plate RPL1, the second reference plate RPL2 and the coupling segments 113 and 123 of the neighboring signal lines 110 and 120 forming the capacitive coupling may form a dual strip line structure.

The dual strip line structure may refer to the structure of the two signal lines between the two voltage plates (e.g., reference plates).

Figure 4A:
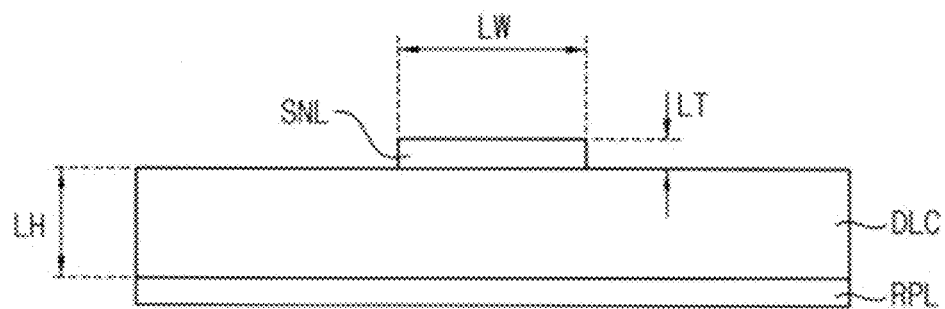
FIGS. 4A and 4B are diagrams illustrating example structures of a signal line according to exemplary embodiments of the present inventive concept.
Figure 4B:
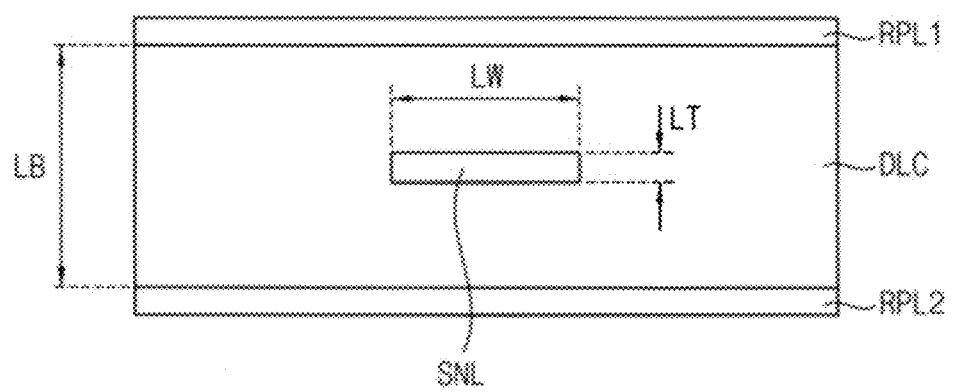

FIGS. 4A and 4B are diagrams illustrating example structures of a signal line according to exemplary embodiments of the present inventive concept.

FIG. 4A illustrates a micro-strip line structure and FIG. 4B illustrates a strip line structure or a tri-plate line structure.

Referring to FIG. 4A, the micro-strip line may include a reference plate RPL, the intermediate dielectric DLC and a signal line SNL. The reference plate RPL may be formed by coating metal on the bottom surface of the intermediate dielectric DLC and the signal line SNL may be formed by patterning a metal line on the top surface of the intermediate dielectric DLC.

Referring to FIG. 4B, the strip line may include two reference plates RPL1 and RPL2, the intermediate dielectric DLC and the signal line SNL. The reference plates RPL1 and RPL2 may be formed by coating metal on the top and bottom surfaces of the intermediate dielectric DLC and the signal line SNL may be formed by patterning a metal line in the center portion of the intermediate dielectric DLC. For example, the metal line may be inserted in the intermediate dielectric DLC by pattering the metal line on a half dielectric and then pressing another half dielectric on the one half dielectric and the metal line.

Parameters of the micro-strip line and the strip line may include the height LH or LB of the intermediate dielectric DLC, the relative dielectric constant of the intermediate dielectric, and/or the dimensions LW (e.g., width) and LT (e.g., thickness) of the signal line. The micro-strip line may have relatively low manufacturing costs, and the strip line may have relatively strong signal transfer characteristics through the structure of electromagnetic shielding.

The dual strip line structure described with reference to FIG. 3B corresponds to a structure where two micro-strip lines (see, e.g., FIG. 4A) are combined or a structure where a single signal line (see, e.g., FIG. 4B) is replaced with two signal lines.

Figure 5:
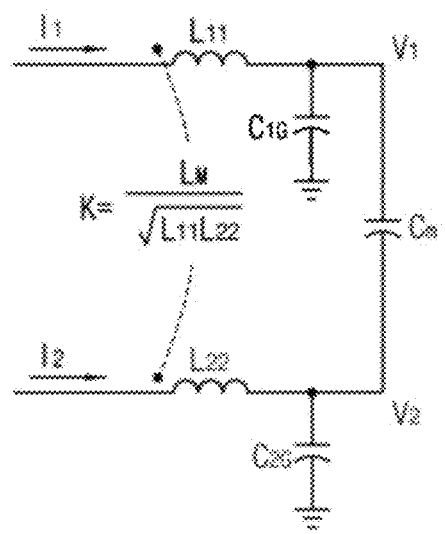
FIG. 5 is a diagram illustrating an exemplary equivalent circuit of coupled signal lines.

FIG. 5 is a diagram illustrating an exemplary equivalent circuit of coupled signal lines.

Signal modes between adjacent transmission lines can be largely classified into an ODD mode and an EVEN mode. When there are two transmission lines, the ODD mode and the EVEN mode are the ones when signals having a 180-degree phase difference and the same phase are applied to the two transmission lines, respectively. First, in the case of inductance, a voltage is generated by inductive coupling and currents I1 and I2 flowing onto two transmission lines have the same amplitude and opposite directions to each other. Assuming that the self inductance L11=L22=L0 and the mutual inductance L12=LM, V1 and V2 may be expressed as:

$$V_1 = L_0 \frac{dI_1}{dt} + L_M \frac{dI_2}{dt} \qquad \text{Equation 1}$$

$$V_2 = L_0 \frac{dI_2}{dt} + L_M \frac{dI_1}{dt} \qquad \text{Equation 2}$$

In the ODD mode, I1=−I2, and V1=−V2, and therefore, these equations may be represented as follows:

$$V_1 = L_0 \frac{dI_1}{dt} + L_M \frac{d(-I_1)}{dt} = (L_0 - L_M) \frac{dI_1}{dt} \qquad \text{Equation 3}$$

$$V_2 = L_0 \frac{dI_2}{dt} + L_M \frac{d(-I_2)}{dt} = (L_0 - L_M)\frac{dI_2}{dt} \qquad \text{Equation 4}$$

$$L_{ODD} = L_{11} - L_M \qquad \text{Equation 5}$$

Referring to Equation 5 above, the total inductance LODD in the ODD mode becomes smaller than the self-inductance L11 by the mutual inductance LM.

Similarly, assuming that the self capacitance C1G=C2G=C0 and the mutual capacitance C12=CM, I1 and I2 may be expressed as:

$$I_1 = C_0 \frac{dV_1}{dt} + C_M \frac{d(V_1 - V_2)}{dt} = (C_0 - C_M)\frac{dV_1}{dt} - C_M \frac{dV_2}{dt} \qquad \text{Equation 6}$$

$$I_2 = C_0 \frac{dV_2}{dt} + C_M \frac{d(V_2 - V_1)}{dt} = (C_0 - C_M)\frac{dV_2}{dt} - C_M \frac{dV_1}{dt} \qquad \text{Equation 7}$$

In the ODD mode, I1=−I2, and V1=−V2, and therefore, these equations may be defined as:

$$I_1 = C_0 \frac{dV_1}{dt} + C_M \frac{d(V_1 - (-V_1))}{dt} = (C_0 + 2C_M)\frac{dV_1}{dt} \qquad \text{Equation 8}$$

$$I_2 = C_0 \frac{dV_2}{dt} + C_M \frac{d(V_2 - (-V_2))}{dt} = (C_0 + 2C_M)\frac{dV_2}{dt} \qquad \text{Equation 9}$$

$$C_{ODD} = C_{1G} + 2C_M = C_{11} + C_M \qquad \text{Equation 10}$$

$$C_{11} = C_{1G} + C_M$$

Referring to Equation 10 above, the total capacitance CODD in the ODD mode becomes greater than the self-capacitance C1G by the mutual capacitance 2CM.

With the total inductance LODD and the total capacitance CODD in Equations 5 and 10 above, ZODD and TDODD may be defined as:

$$Z_{ODD} = \sqrt{\frac{L_{ODD}}{C_{ODD}}} = \sqrt{\frac{L_{11} - L_{12}}{C_{11} + C_{12}}} \qquad \text{Equation 11}$$

$$TD_{ODD} = \sqrt{L_{ODD} C_{ODD}} = \sqrt{(L_{11} - L_{12})(C_{11} + C_{12})} \qquad \text{Equation 12}$$

The EVEN mode is one in which signals having the same phase and the same amplitude are applied to the two transmission lines, respectively. First, in the ease of inductance, a voltage is generated by an inductive coupling and currents I1 and I2 flowing onto the two transmission lines have the same amplitude and the same directions. Assuming that the self-inductance L11=L22 =L0 and the mutual inductance L12=LM, V1 and V2 may be expressed as Equations 1 and 2 above, In the ODD mode, I1=I2, and V1=V2, and therefore, these equations may be represented as:

$$V_1 = L_0 \frac{dI_1}{dt} + L_M \frac{d(I_1)}{dt} = (L_0 + L_M)\frac{dI_1}{dt} \qquad \text{Equation 13}$$

$$V_2 = L_0 \frac{dI_2}{dt} + L_M \frac{d(I_2)}{dt} = (L_0 + L_M)\frac{dI_2}{dt} \qquad \text{Equation 14}$$

$$L_{EVEN} = L_{11} + L_M \qquad \text{Equation 15}$$

Referring to Equation 15 above, the total inductance LEVEN in the EVEN mode has the self-inductance L11 added to the mutual inductance LM.

Similarly, assuming that the capacitance may be expressed by Equations 6 and 7 above, and in the EVEN mode, I1=I2, and V1=V2, and therefore, I1 and I2 may be represented again as:

$$I_1 = C_0 \frac{dV_1}{dt} + C_M \frac{d(V_1 - V_1)}{dt} = C_0 \frac{dV_1}{dt} \qquad \text{Equation 16}$$

$$I_2 = C_0 \frac{dV_2}{dt} + C_M \frac{d(V_2 - V_2)}{dt} = C_0 \frac{dV_2}{dt} \qquad \text{Equation 17}$$

$$C_{EVEN} = C_{1G} = C_{11} - C_M \qquad \text{Equation 18}$$

$$C_{11} = C_{1G} + C_M$$

Thus, the total capacitance CEVEN in the EVEN mode becomes equal to the self-capacitance C1G, as shown in Equation 18 above. Using the total inductance LEVEN and the total capacitance CEVEN in Equations 15 and 18 above, ZEVEN and TDEVEN may be defined as:

$$Z_{EVEN} = \sqrt{\frac{L_{EVEN}}{C_{EVEN}}} = \sqrt{\frac{L_{11} + L_{12}}{C_{11} - C_{12}}} \qquad \text{Equation 19}$$

$$TD_{EVEN} = \sqrt{L_{EVEN} C_{EVEN}} = \sqrt{(L_{11} + L_{12})(C_{11} - C_{12})} \qquad \text{Equation 20}$$

The characteristic impedance of a transmission line varies depending on adjacent transmission lines and a signal mode due to the influence of coupling between the adjacent transmission lines, which causes a difference in the transmission rates of signals. Thus, this transmission rate difference acts as a factor that may impair a timing margin.

The transmission rate in the transmission line structure of the printed circuit board may depend mainly on the dielectric constant of the propagation media. In case of the micro-strip line described with reference to FIG. 4A, the propagation media includes the intermediate dielectric DLC between the signal line SNL and the reference plate RPL and the air over the signal line SNL. The dielectric constant of the air is '1' and the dielectric constant of the intermediate dielectric DLC varies depending on the material. The dielectric constant of the intermediate dielectric DLC is about '4.3'. The electromagnetic field may be biased to the intermediate dielectric DLC or the air depending on the EVEN mode or the ODD mode. Thus, the effective dielectric constant may be varied depending on the signal modes and the gap of the transmission rate is caused between the EVEN mode and the ODD mode. In case of the strip line described with reference to FIG. 4B, the electromagnetic field may be symmetric with respect to the signal line SNL and may be restricted between the reference plates RPL1 and RPL2 to minimize leakage of the electromagnetic field. The micro-strip line may be used but use of the micro-strip line may involve the reduction of the effect of the crosstalk noise that is caused in a bandwidth of a relatively high frequency.

Figure 6A:
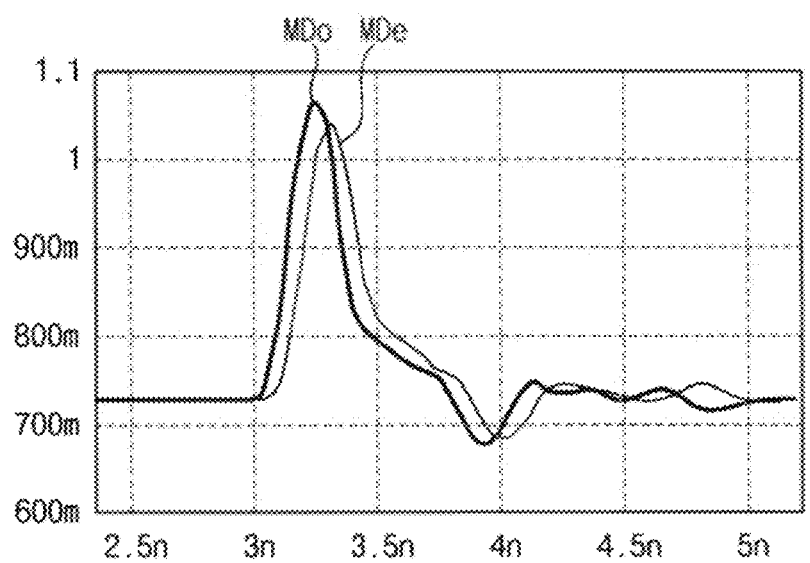
FIGS. 6A, 6B and 6C are diagrams illustrating exemplary operation characteristics of a signal channel when capacitive coupling is not generated between signal lines.
Figure 6B:
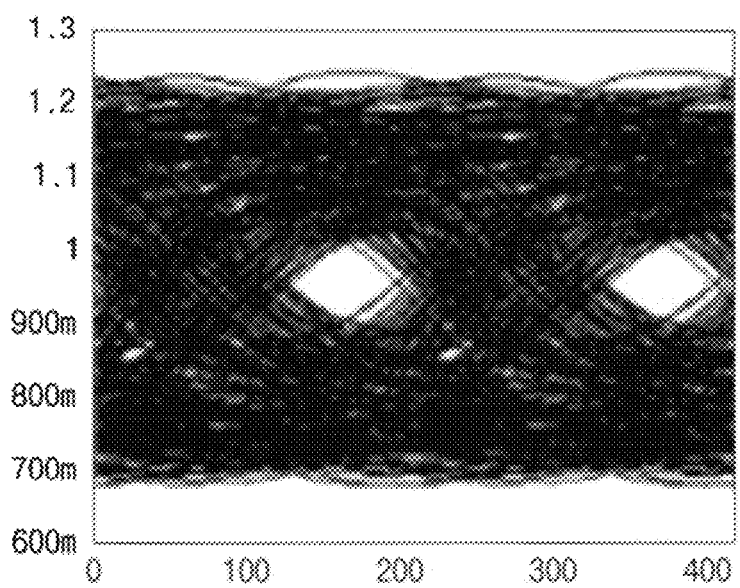
Figure 6C:
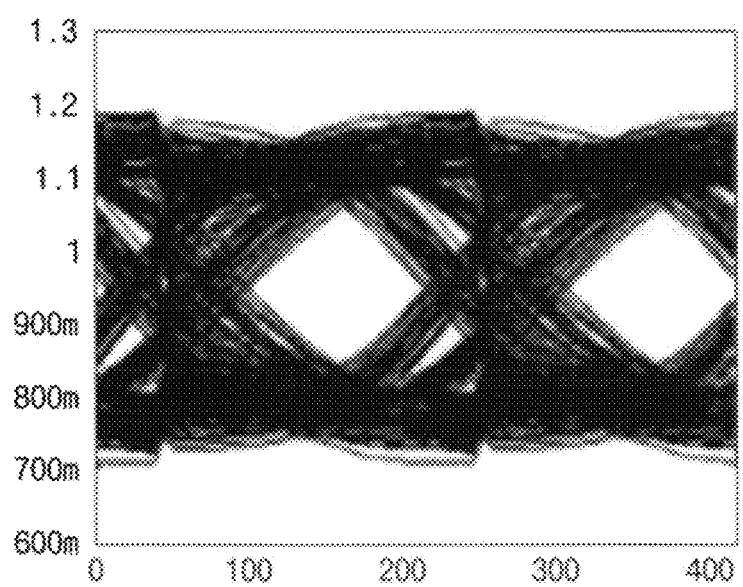
Figure 7A:
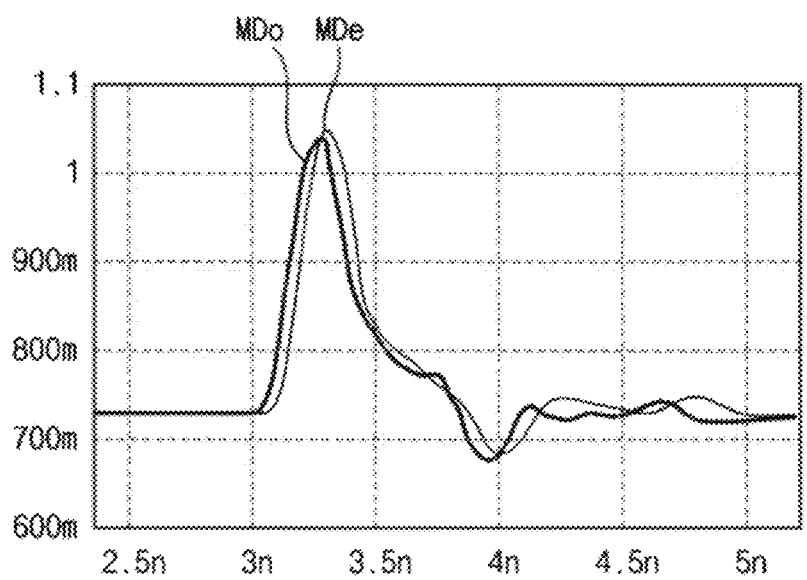
FIGS. 7A, 7B and 7C are diagrams illustrating exemplary operation characteristics of a signal channel when capacitive coupling is generated between signal lines in a vertical direction.
Figure 7B:
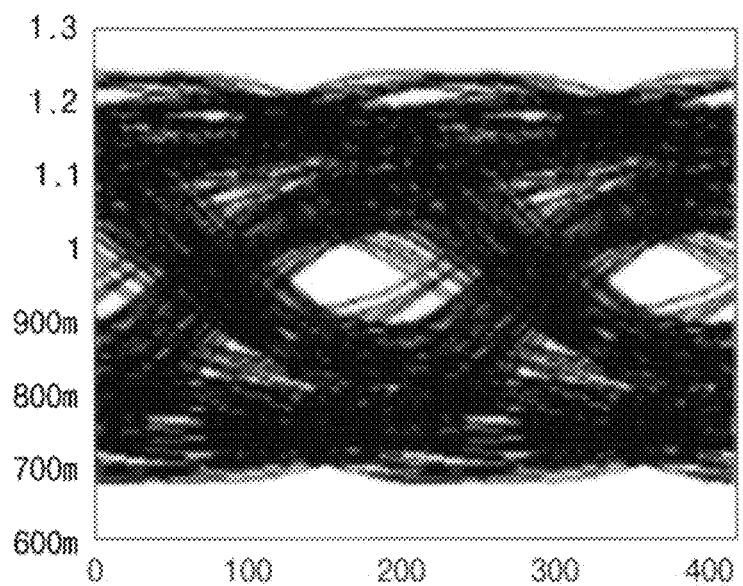
Figure 7C:
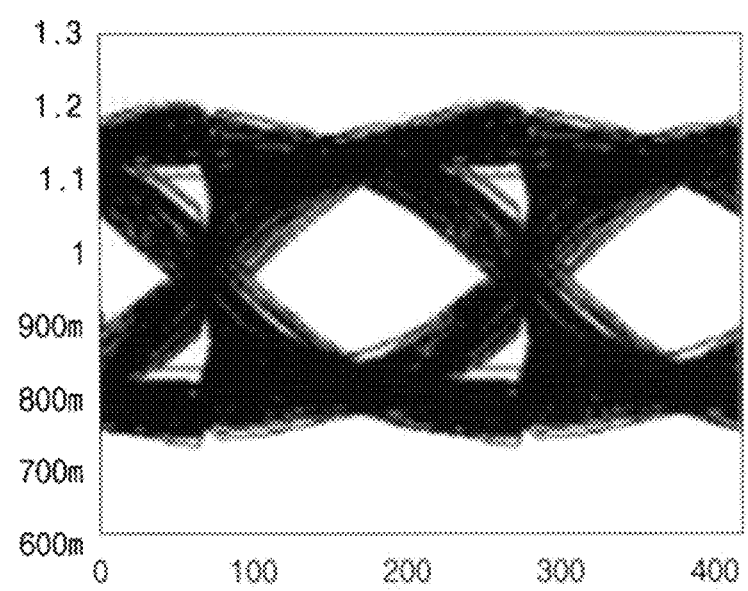

FIGS. 6A, 6B and 6C are diagrams illustrating exemplary operation characteristics of a signal channel when capacitive coupling is not generated between signal lines. FIGS. 7A, 7B and 7C are diagrams illustrating exemplary operation characteristics of a signal channel when capacitive coupling is generated between signal lines in a vertical direction.

Referring to FIGS. 6A, 6B, 6C, 7A, 7B and 7C, the vertical axis represents a voltage and the horizontal axis represents a time.

FIGS. 6A and 7A illustrate response at a reception end of a signal channel when a single pulse is driven at a transmission end of the signal channel. Although skew between the EVEN mode (e.g., MDe) and the ODD mode (e.g., MDo) is caused in both cases of FIGS. 6A and 7A, the skew may be reduced in the case of FIG. 7A where the capacitive coupling is generated in comparison with the case of FIG. 6A where the capacitive coupling is not generated.

FIGS. 6B and 7B illustrate eye diagrams before compensating for the skew and FIGS. 6C and 7C illustrate eye diagrams after compensating for the skew using an equalizer.

The eye size in FIG. 6C is about 115 ps (picosecond) and 220 mV whereas the eye size in FIG. 7C is about 155 ps and 230 mV. Thus, in comparison with the case of FIGS. 6B and 6C, the crosstalk noise may be reduced and the size of the eye may be increased in the case of FIGS. 7B and 7C when the capacitive coupling is generated in the vertical direction (e.g., the vertical direction z) according to an exemplary embodiment of the present inventive concept.

Figure 8A:
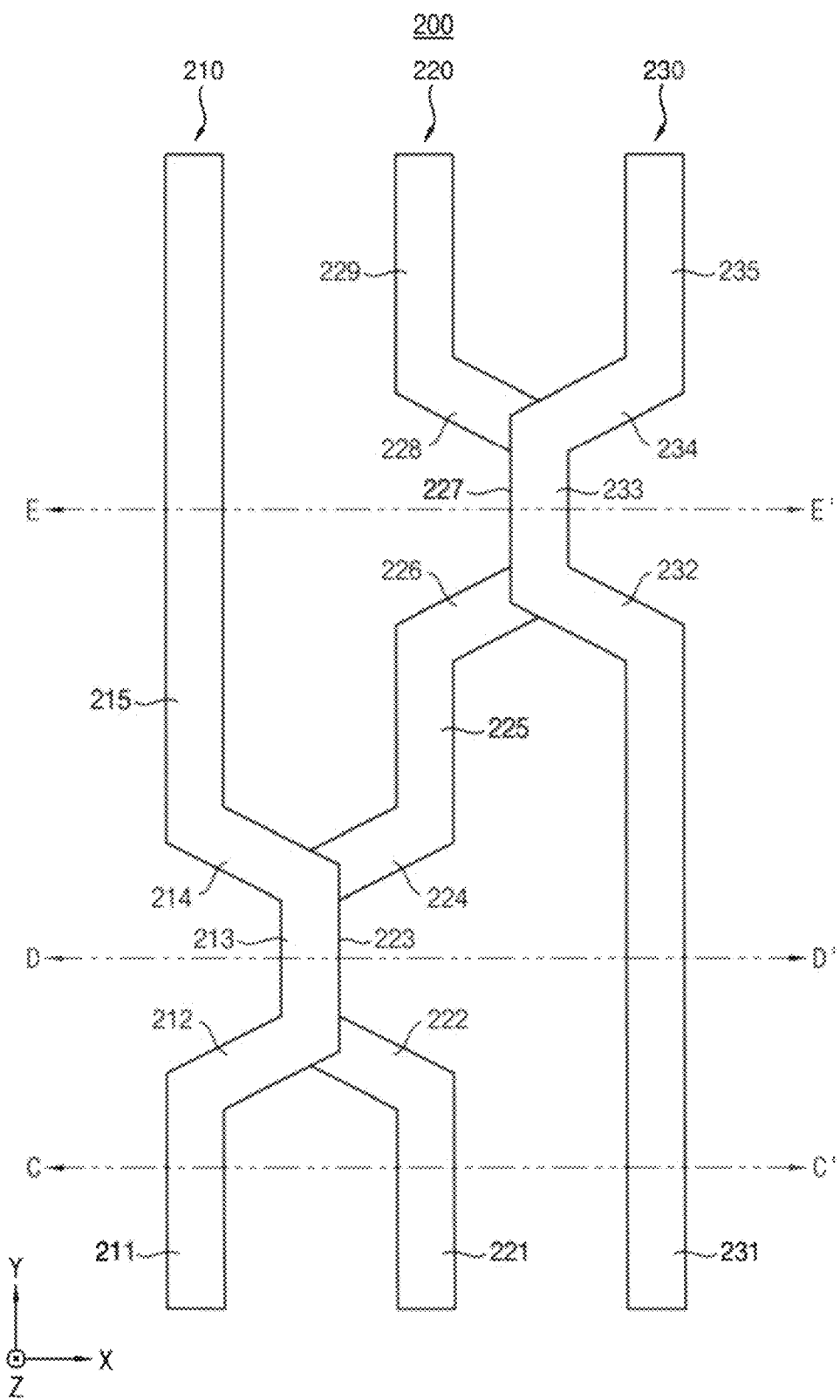
FIGS. 8A and 8B are plan views of a signal channel according to exemplary embodiments of the present inventive concept.
Figure 8B:
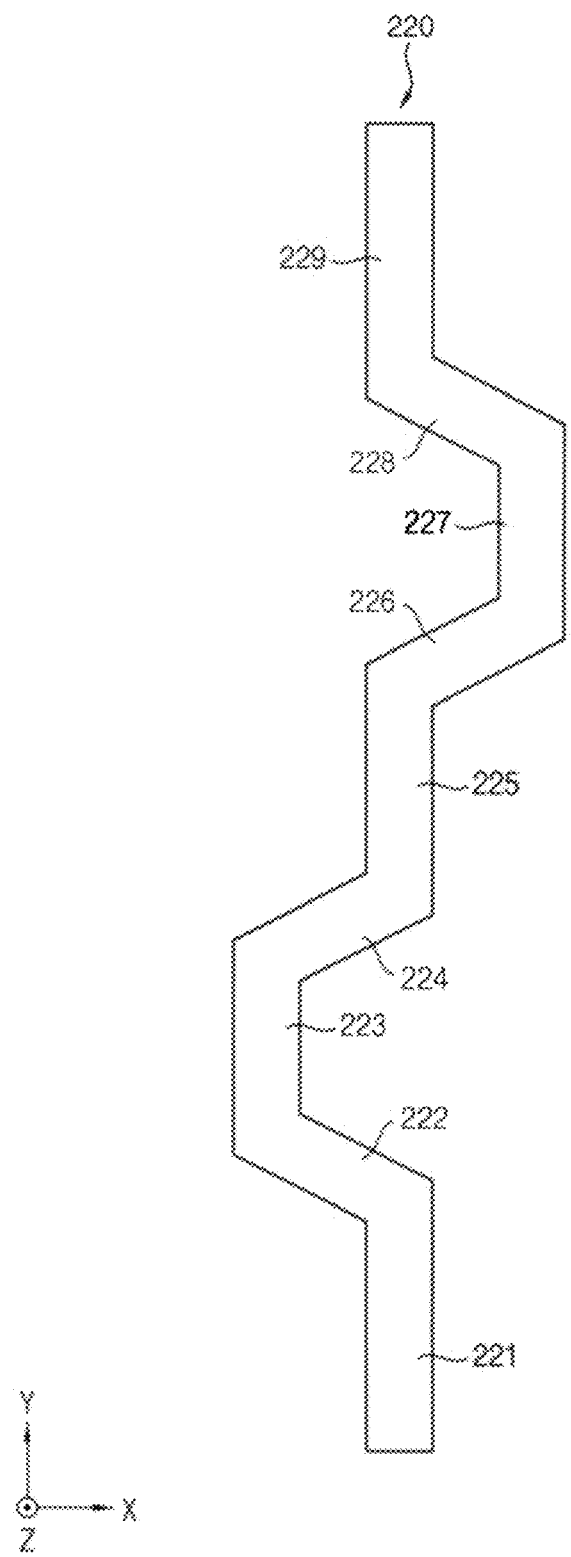
Figure 9A:
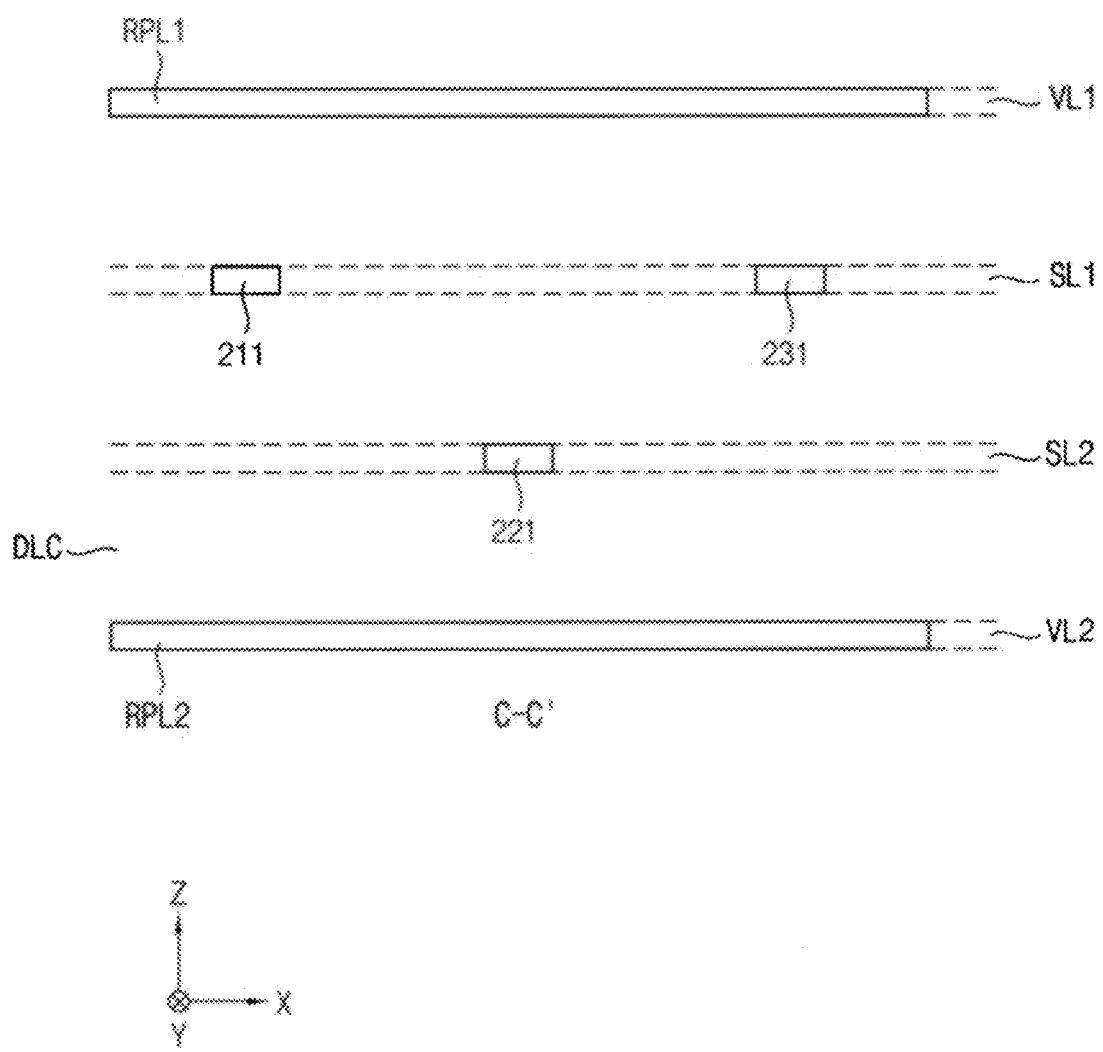
FIGS. 9A, 9B and 9C are cross-sectional views of the signal channel of FIG. 8A.
Figure 9B:
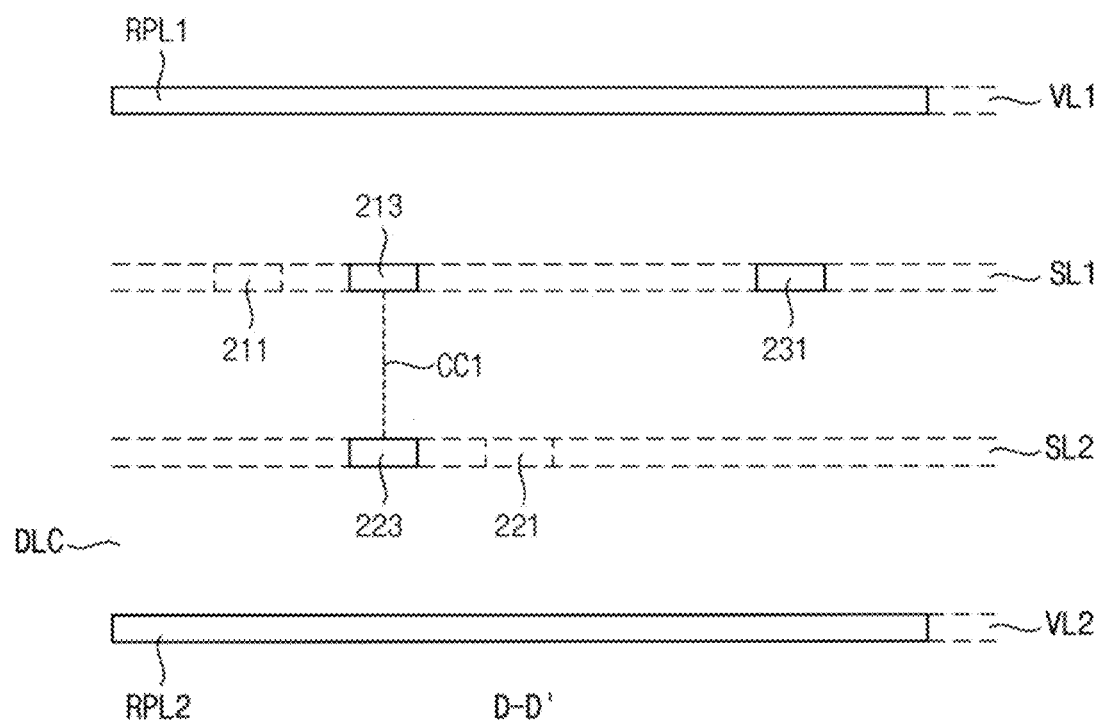
Figure 9C:
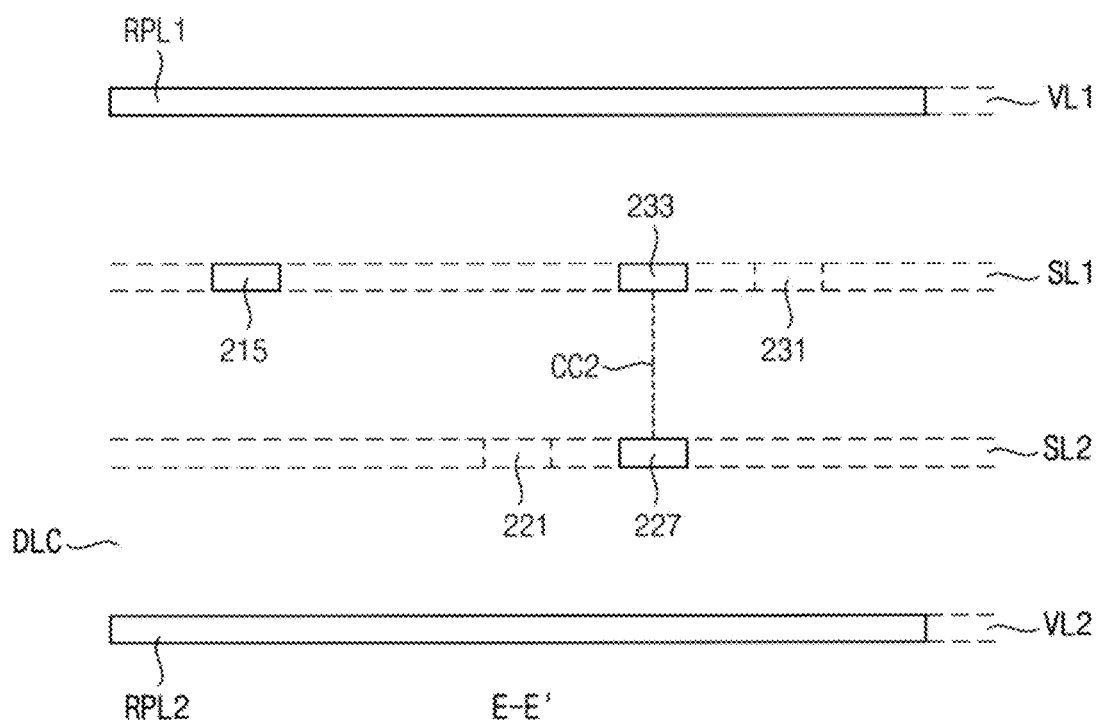

FIGS. 8A and 8B are plan views of a signal channel according to exemplary embodiments of the present inventive concept. FIGS. 9A, 9B and 9C are cross-sectional views of the signal channel of FIG. 8A.

FIG. 8A is a plan view of a first signal line 210, a second signal line 220 and a third signal line 230 and FIG. 8B is a plan view of the second signal line 220. FIG. 9A is a cross-sectional view of the signal channel along a line C-C' in FIG. 8A, FIG. 9B is a cross-sectional view of the signal channel along a line D-D' in FIG. 8A, and FIG. 9C is a cross-sectional view of the signal channel along a line E-E' in FIG. 8A.

Referring to FIGS. 8A, 8B, 9A, 9B and 9C, a signal channel 200 may include the first signal line 210, the second signal line 220 and the third signal line 230 that are extended in the column direction Y. The signal channel 200 may further include the first reference plate RPL1 and the second reference plate RPL2 (see, e.g., FIGS. 9A, 9B and 9C).

The first signal line 210 may be positioned in the first signal layer SL1. The second signal line 220 may be positioned in the signal layer SL2 that is spaced apart from the first signal layer SL1 in the vertical direction Z. The third signal line 230 may be positioned in the first signal layer SL2. The first signal line 210 and the third signal line 230 may be adjacent to the second signal line 220 in the row direction X perpendicular to the column direction Y.

The first signal line 210 and the second signal line 220 may form a first capacitive coupling CC1 in the vertical direction Z and the second signal line 220 and the third signal line 230 may form a second capacitive coupling CC2 in the vertical direction Z.

The first signal line 210 may include first non-coupling segments 211 and 215, a first coupling segment 213 and first connecting segments 212 and 214. The first non-coupling segments 211 and 215 and the first coupling segment 213 may be extended in the column direction Y. For example, the first non-coupling segments 211 and 215 and the first coupling segment 213 may have a shape of a straight line substantially parallel to the column direction Y.

The first coupling segment 213 may be positioned relatively closer to the second signal line 220 in comparison with the first non-coupling segments 211 and 215. The first coupling segment 213 may form the first capacitive coupling CC1 with the second signal line 220.

The first connecting segments 212 and 214 may connect the first coupling segment 213 to the first non-coupling segments 211 and 215. The first connecting segments 212 and 214 may be extended in a diagonal direction with respect to the column direction Y.

The second signal line 220 may include second non-coupling segments 221, 225 and 229, second coupling segments 223 and 227, and second connecting segments 222, 224, 226 and 228. The second non-coupling segments 221, 225 and 229 and the second coupling segments 223 and 227 may be extended in the column direction Y. For example, the second non-coupling segments 221, 225 and 229, second coupling segments 223 and 227 may have a shape of a straight line substantially parallel to the column direction Y.

The second coupling segment 223 may be positioned relatively closer to the first signal line 210 in comparison with the second non-coupling segments 221, 225 and 229. The second coupling segment 223 may form the first capacitive coupling CC1 with the first signal line 210. The second coupling segment 227 may be positioned relatively closer to the third signal line 230 in comparison with the second non-coupling segments 221, 225 and 229. The third signal line 230 may form the second capacitive coupling CC2 with the third signal line 230.

The second connecting segments 222, 224, 226 and 228 may connect the second coupling segments 223 and 227 to the second non-coupling segments 221, 225 and 229. The second connecting segments 222, 224, 226 and 228 may be extended in a diagonal direction with respect to the column direction Y.

The third signal line 230 may include third non-coupling segments 231 and 235, a third coupling segment 233 and third connecting segments 232 and 234. The third non-coupling segments 231 and 235 and the third coupling segment 233 may be extended in the column direction Y. For example, the third non-coupling segments 231 and 235 and the third coupling segment 233 may have a shape of a straight line substantially parallel to the column direction Y.

The third coupling segment 233 may be positioned relatively closer to the second signal line 220 in comparison with the third non-coupling segments 231 and 235. The third coupling segment 233 may form the second capacitive coupling CC2 with the second signal line 220.

The third connecting segments 232 and 234 may connect the third coupling segment 233 to the third non-coupling segments 231 and 235. The third connecting segments 232 and 234 may be extended in a diagonal direction with respect to the column direction Y.

The first coupling segment 213 and the one second coupling segment 223 may be positioned in the row direction X such that the first coupling segment 213 and the one second coupling segment 223 are overlapped with each other in the vertical direction Z to form the first capacitive coupling CC1. The first coupling segment 213 may be positioned to the right in comparison with the first non-coupling segments 211 and 215, the one second coupling segment 223 may be positioned to the left in comparison with the second non-coupling segments 221, 225 and 229, and thus the first coupling segment 213 and the one second coupling segment 223 formed in the different signal layers SL1 and SL2 may be overlapped in the vertical direction Z (e.g., when they are viewed from above).

A distance between the first coupling segment 213 and the one second coupling segment 223 may be small enough to form a mutual capacitance between the first coupling segment 213 and the one second coupling segment 223 so that the first capacitive coupling CC1 may be generated or formed between the first signal line 210 and the second signal line 220.

The third coupling segment 233 and the other second coupling segment 227 may be positioned in the row direction X such that the third coupling segment 233 and the other second coupling segment 227 are overlapped with each other in the vertical direction Z to form the second capacitive coupling CC2. The third coupling segment 233 may be positioned to the left in comparison with the third non-coupling segments 231 and 235, the second coupling segment 227 may be positioned to the right in comparison with the second scion-coupling segments 221, 225 and 229, and thus the third coupling segment 233 and the other second coupling segment 227 formed in the different signal layers SL1 and SL2 may be overlapped in the vertical direction Z (e.g., when they are viewed from above).

A distance between the third coupling segment 233 and the other second coupling segment 227 may be small enough to form a mutual capacitance between the third coupling segment 233 and the other second coupling segment 227 so that the second capacitive coupling CC2 may be generated or formed between the third signal line 230 and the second signal line 220.

Thus, the second signal line 220 may include the two coupling segments 223 and 227 forming the two capacitive couplings CC1 and CC2 with the coupling segments 213 and 233 of the two signal lines 210 and 230, respectively, adjacent to the second signal line 220 at opposite sides of the second signal line 220 in the row direction X.

Referring to FIGS. 9A, 9B and 9C, the signal channel 200 may include the first reference plate RPL1 positioned in the first voltage layer VL1 over the signal layers SL1 and SL2 and the second reference plate RPL2 positioned in the second voltage layer VL2 below the signal layers SL1 and SL2. In this case, the signal channel 200 may have a micro-strip line structure.

The first reference plate RPL1 and the second reference plate RPL2 may each include metal to which a reference voltage is applied, and a space between the first reference plate RPL1 and the second reference plate RPL2 may be substantially filled with intermediate dielectric DLC. The reference voltage applied to the first reference plate RPL1 and the second reference plate RPL2 may be a ground voltage.

Referring to FIG. 9B, the first reference plate RPL1, the second reference plate RPL2 and the coupling segments 213 and 223 of the neighboring signal lines 210 and 220 forming the first capacitive coupling CC1 may form the above-described dual strip line structure. Referring to FIG. 9C, the first reference plate RPL1, the second reference plate RPL2 and the coupling segments 227 and 233 of the neighboring signal lines 220 and 230 forming the second capacitive coupling CC2 may form the dual strip line structure.

Figure 10A:
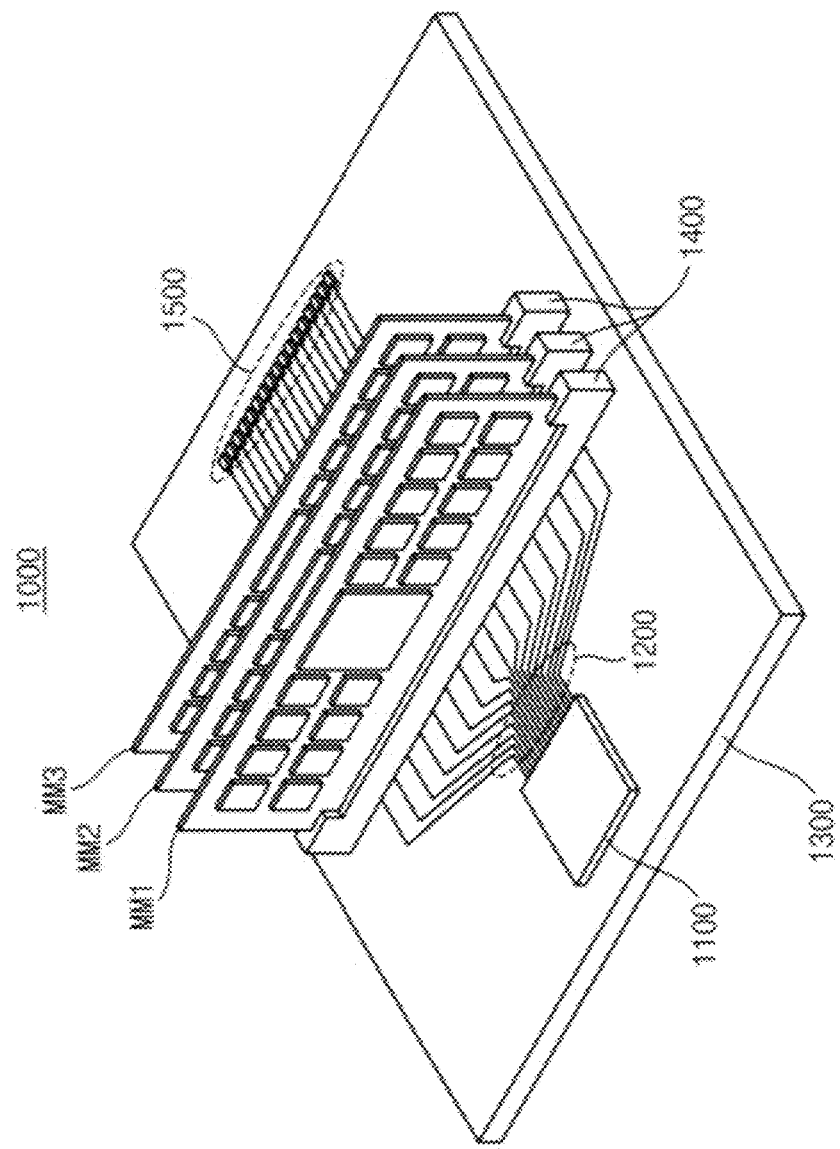
FIG. 10A is a diagram illustrating a memory system according to an exemplary embodiment of the present inventive concept.
Figure 10B:
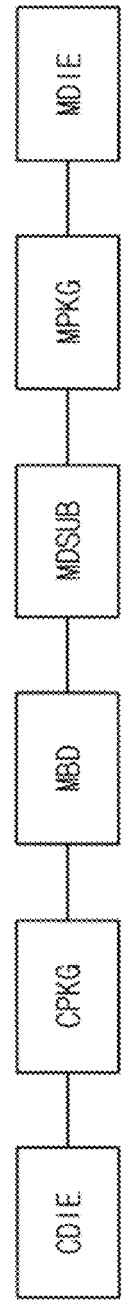
FIG. 10B is a diagram illustrating an exemplary signal path of the memory system of FIG. 10A.

FIG. 10A is a diagram illustrating a memory system according to an exemplary embodiment of the present inventive concept. FIG. 10B is a diagram illustrating an exemplary signal path of the memory system of FIG. 10A.

Referring to FIG. 10A, in a memory system 1000, a memory controller 1100 and a plurality of connecting sockets 1400, which are mounted on a main board 1300, are connected through a system bus 1200. The memory controller 1100 may be a system on chip having a memory control function. A desired number of the memory modules MM1, MM2 and MM3 may be coupled in the connecting sockets 1400, and a plurality of memory chips may be mounted on each of the memory modules MM1, MM2 and MM3. Termination resistors 1500 may be disposed on the main board 1300 for impedance matching.

Referring to FIG. 10B, in a memory system, signal transfer between a controller die CDIE and a memory die MDIE may be performed through a controller package CPKG, a main board MBD, a module substrate MDSUB and a memory package MPKG. The controller die CDIE and the controller package CPKG may correspond to the memory controller 1100 in FIG. 10A, and the memory package MPKG and the memory die MDIE may correspond to the one memory chip mounted on the memory module.

In general, the mutual inductance is dominant on the signal path of the controller package CPKG and the main board MBD. Thus, the crosstalk noise through substantially the entire signal path may be reduced by intentionally generating the mutual capacitance at the module substrate MDSUB. According to an exemplary embodiment of the present inventive concept, the crosstalk noise may be reduced without increase of occupation area by generating capacitive coupling between signal lines in the vertical direction and operation speeds of devices and systems including the signal channel and/or the module substrate may be enhanced.

Figure 11:
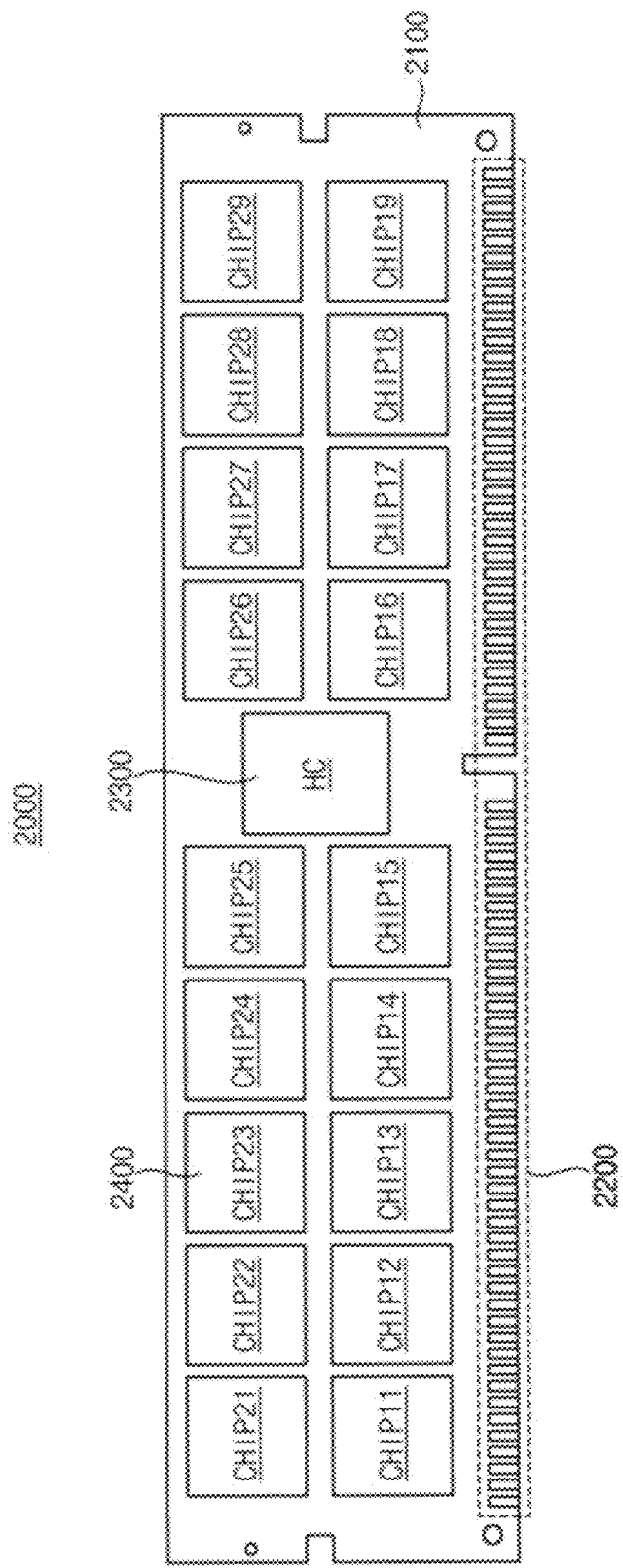
FIG. 11 is a diagram illustrating a memory module according to an exemplary embodiment of the present inventive concept.

FIG. 11 is a diagram illustrating a memory module according to an exemplary embodiment of the present inventive concept.

FIG. 11 illustrates a memory module 2000 according to an exemplary embodiment of the present inventive concept. Referring to FIG. 11, the memory module 2000 includes a plurality of memory chips CHIP11 to CHIP19 and CHIP21 to CHIP29 arranged on a module substrate 2100 along two rows. The number of rows of the memory chips is not limited to two. The module substrate 2100 may be implemented as a printed circuit board (PCB) 2200. In the module substrate 2100, a signal channel may be formed according to an exemplary embodiment of the present inventive concept such that signal lines generate the capacitive coupling in the vertical direction.

The memory module 2000 may be implemented by a DIMM (dual in-line memory module), SO-DIMM (small outline DIMM), RDIMM (ECC Registered DIMM), UDIMM (ECC Unbuffered DIMM), FBDIMM (fully buffered DIMM), RIMM (Rambus in-line memory module), or SIMM (single in-line memory module).

A plurality of taps or pins for electrical connection with an external device may be formed at side portions of the module substrate 2100. The memory module 2000 may further include a hub controller HC 2300 or an advanced memory buffer (AMB) for controlling the memory chips CHIP11 to CHIP19 and CHIP21 to CHIP29. The hub controller HC may receive a data packet from an external memory controller. The huh controller HC may convert the input data packet into control signals, an address, and data to transfer them to the memory chips CHIP11 to CHIP19 and CHIP21 to CHIP29. The hub controller HC may generate a packet on data output from each of the memory chips CHIP11 to CHIP19 and CHIP21 to CHIP29 and outputs the packet to the external memory controller.

A memory module where a plurality of memory chips is mounted on the PCB 2200 is largely divided into a SIMM and a DIMM. The same signals are applied to both surfaces of the PCB of the SIMM, and different signals are applied to both surfaces of the PCB of the DIMM. The DIMM is divided into a registered DIMM and a FBDIMM. In the registered DIMM, since the modules are connected in parallel to a bus of a memory system, the number of modules that are connectable may be restricted. Thus, the registered DIMM may have a limited capacity. In case of the FBDIMM, since a mother board chipset and an AMB of the FBDIMM are connected in a point-to-point manner, the number of modules that may be connected to the memory system may increase. Thus, the capacity of the FBDIMM need not be limited due to the number of connectable modules. Also, the FBDIMM operates in relatively high speed using a packet protocol. Exemplary embodiments of the present inventive concept may be applied to the module substrate or to various types of PCBs; however, exemplary embodiments of the present invention are not limited thereto.

Figure 12:
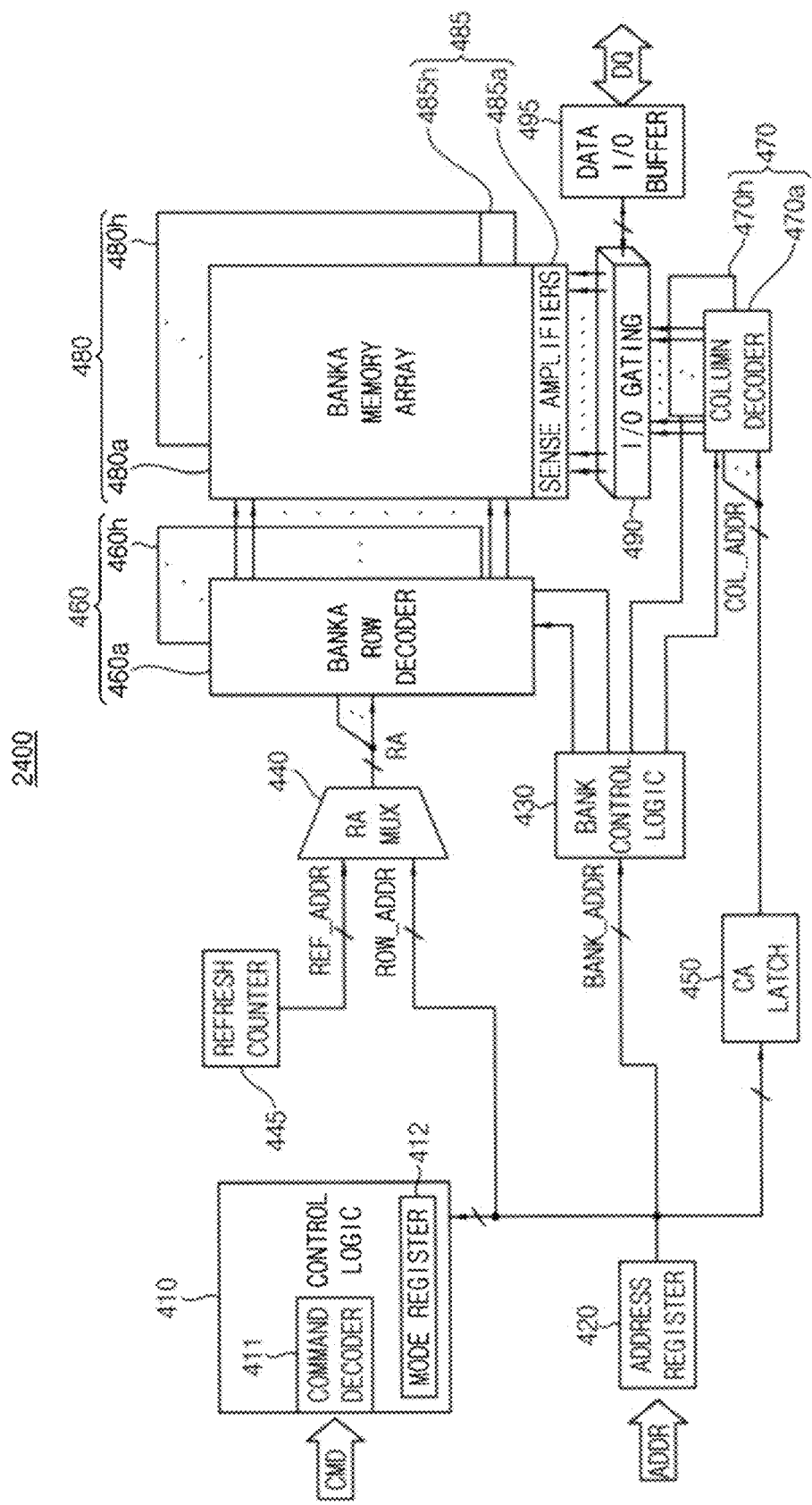
FIG. 12 is a diagram illustrating an example of a memory device included in the memory module of FIG. 11.

FIG. 12 is a diagram illustrating an example of a memory device included in the memory module of FIG. 11.

A DRAM is described as an example of the memory integrated circuits with reference to FIG. 12. The memory device according to an exemplary embodiment of the present inventive concept may be any of a variety of memory cell architectures, including, but not limited to, volatile memory architectures such as DRAM, TRAM and SRAM, or non-volatile memory architectures, such as ROM, flash memory, FRAM, or MRAM.

Referring to FIG. 12, a memory integrated circuit 2400 may include a control logic 410, an address register 420, a bank control logic 430, a row address multiplexer (RA MUX) 440, a column address latch (CA LATCH) 450, a row decoder 460, a column decoder 470, a memory cell array 480, a sense amplifier unit 485, an input/output (I/O) gating circuit 490, a data input/output (I/O) buffer 495, and/or a refresh counter 445.

The memory cell array 480 may include a plurality of bank arrays 480a~480h. The row decoder 460 may include a plurality of bank row decoders 460a~460h respectively coupled to the bank arrays 480a~480h, the column decoder 470 may include a plurality of bank column decoders 470a~470h respectively coupled to the bank arrays 480a~480h, and the sense amplifier unit 485 may include a plurality of bank sense amplifiers 485a~485h respectively coupled to the bank arrays 480a~480h.

The address register 420 may receive an address ADDR including a bank address BANK_ADDR, a row address ROW_ADDR and a column address COL_ADDR from the memory controller. The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. One of the bank row decoders 460a~460h corresponding to the bank address BANK_ADDR may be activated in response to the bank control signals, and one of the bank column decoders 470a~470h corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the bank row decoders 460a~460h.

The activated one of the bank row decoders 460a~460h may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In an exemplary embodiment of the present inventive concept, in a burst mode, the column address latch 450 may generate column addresses that increment from the received column address COL_ADDR. The column address latch 450 may apply the temporarily stored or generated column address to the bank column decoders 470a~470h.

The activated one of the bank column decoders 470a~470h may decode the column address COL_ADDR that is output from the column address latch 450, and may control the input/output gating circuit 490 to output data corresponding to the column address COL_ADDR.

The I/O gating circuit 490 may include a circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by one of the bank sense amplifiers 485a~48h coupled to the one bank array from which the data is to be read, and may be stored in the read data latches. The data stored in the read data latches may be provided to the memory controller via the data I/O buffer 495. Data DQ to be written in one bank array of the bank arrays 480a~480h, may be provided to the data I/O buffer 495 from the memory controller. The write driver may write the data DQ in one bank array of the bank arrays 480a~480h.

The control logic 410 may control operations of the memory integrated circuit 400. For example, the control logic 410 may generate control signals for the memory integrated circuit 400 to perform a write operation or a read operation. The control logic 410 may include a command decoder 411 that decodes a command CMD received from the memory controller and a mode register set 412 that sets an operation mode of the memory device or the memory integrated circuit 400. For example, the command decoder 411 may generate the control signals corresponding to the command CMD by decoding a write enable signal, a row address strobe signal, a column address strobe signal, a chip selection signal, etc.

Figure 13:
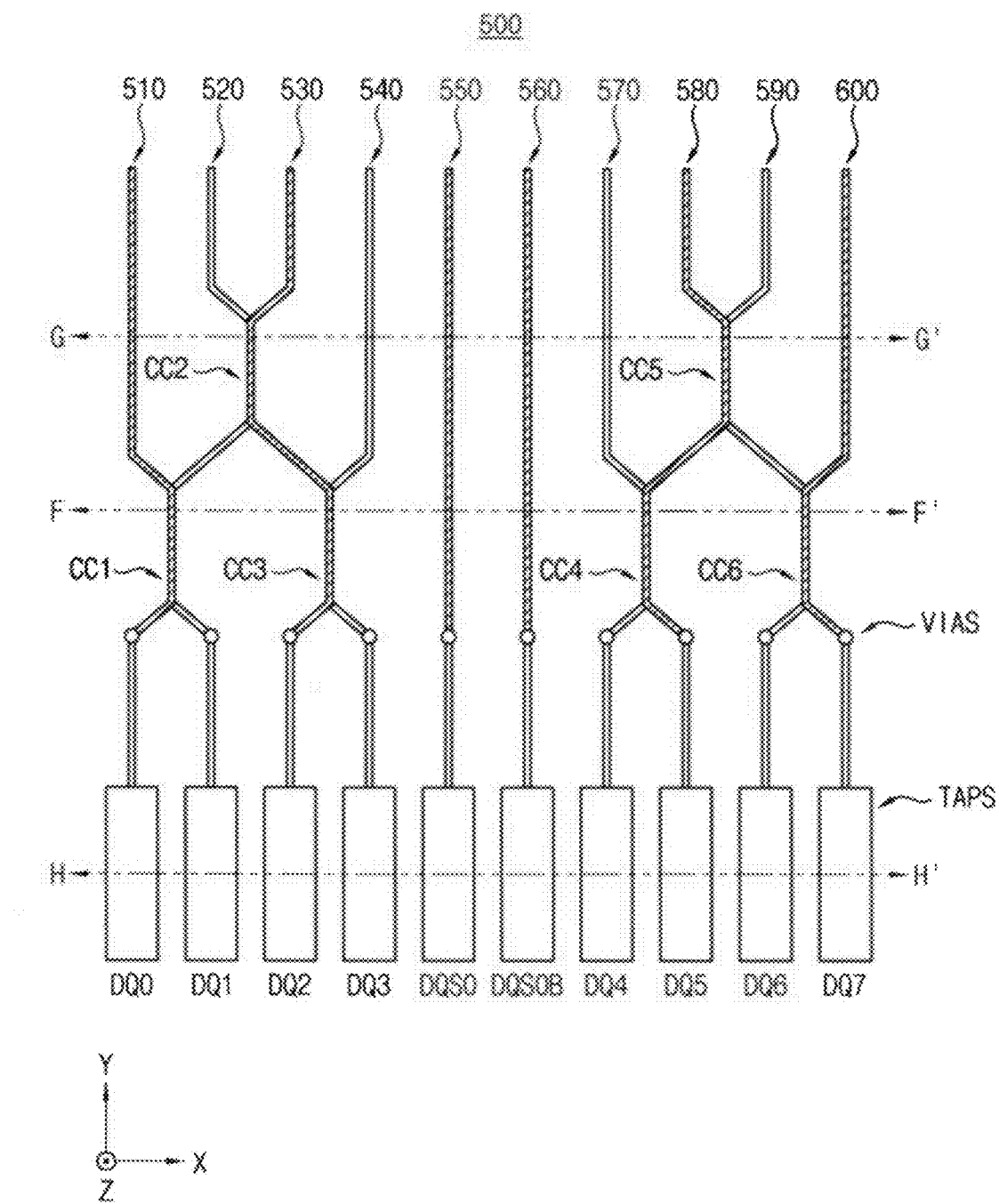
FIGS. 13 and 14 are diagrams illustrating a memory module according to an exemplary embodiment of the present inventive concept.
Figure 14:
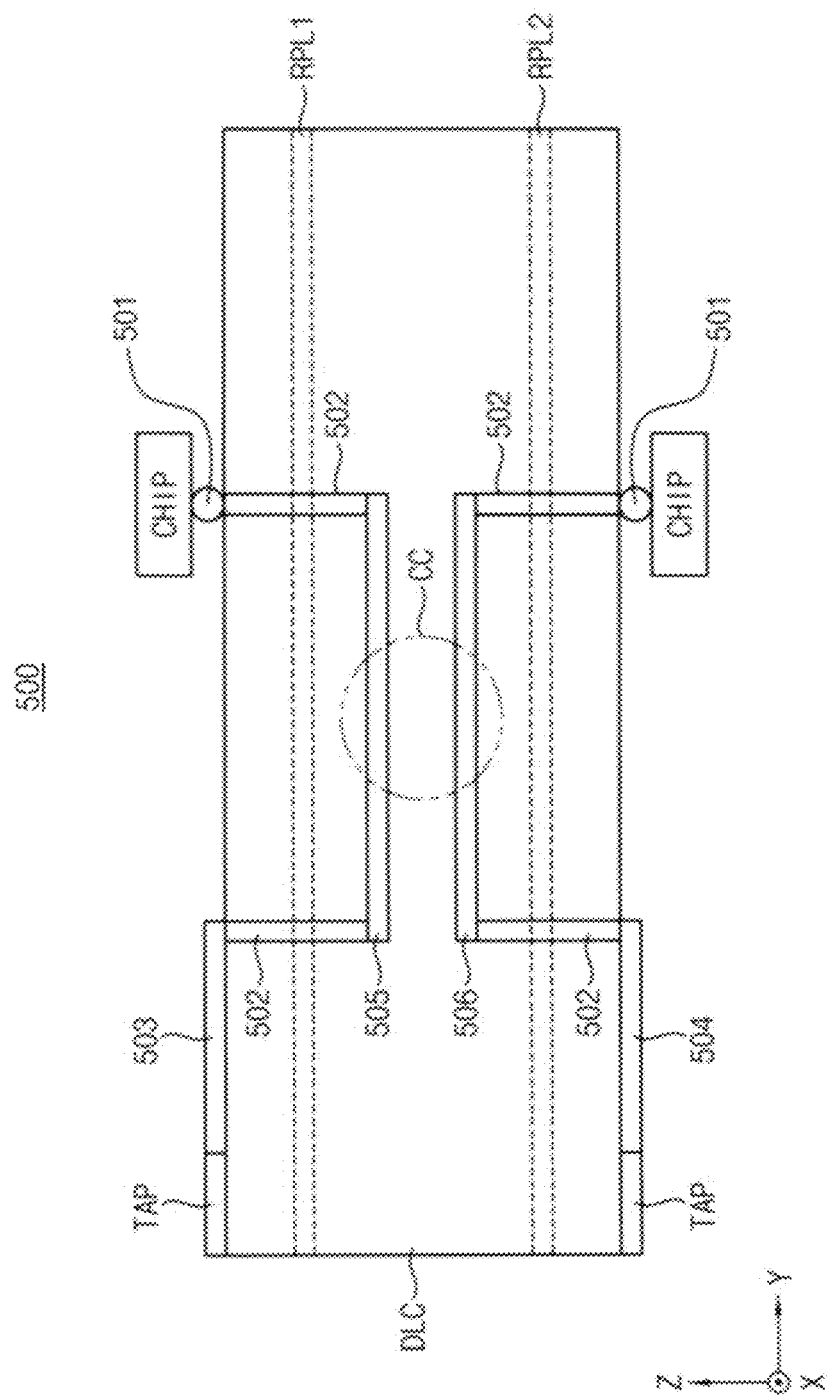

FIGS. 13 and 14 are diagrams illustrating a memory module according to an exemplary embodiment of the present inventive concept.

FIG. 13 illustrates an example horizontal layout of a memory module and FIG. 14 illustrates an example vertical structure of the memory module.

Referring to FIGS. 13 and 14, a memory module 500 may include a module substrate and a plurality of memory chips CHIP mounted on surfaces of the module substrate.

The module substrate may include a substrate body including dielectric material DLC and a signal channel for interfacing communication between the memory chips CHIP and an external controller. The memory chips CHIP may be electrically connected to the signal channel through solder halls 501.

The signal channel may include a plurality of inner signal lines 510, 520, 530, 540, 550, 560, 570, 580, 590 and 600 formed between reference plates RPL1 and RPL2, contact vias 502, outer signal lines 503 and 504 formed on the surface of the substrate body and a plurality of taps TAP. For example, the taps TAP may be in positions corresponding to data terminals DQ0~DQ7 and data strobe terminals DQS0 and DQS0B.

The hatched signal lines 510, 530, 550, 560, 580 and 600 in FIG. 13 corresponds to a signal line 505 formed in the upper signal layer in FIG. 14, and the not-hatched signal lines 520, 540, 570 and 590 in FIG. 13 corresponds to a signal line 506 formed in the lower signal layer in FIG. 14.

Referring to FIG. 13, the data terminals DQ0, DQ1, DQ2 and DQ3 corresponding to a nibble or four bits may be positioned at the left side of the data strobe terminals DQS0 and DQS0B and the data terminals DQ4, DQ5, DQ6 and DQ7 corresponding to a nibble may be disposed at the right side of the data strobe terminals DQS0 and DQS0B. Among the left-side signal lines 510, 520, 530 and 540, the data lines 510 and 530 corresponding to the even-numbered data terminals DQ0 and DQ2 may be positioned in the upper signal layer and the data lines 520 and 540 corresponding to the odd-numbered data terminals DQ1 and DQ3 may be positioned in the lower signal layer. Among the right-side signal lines 570, 580, 590 and 600, the data lines 570 and 590 corresponding to the even-numbered data terminals DQ4 and DQ6 may be positioned in the lower signal layer and the data lines 580 and 600 corresponding to the odd-numbered data terminals DQ5 and DQ7 may be positioned in the upper signal layer.

Thus, data lines formed in a first signal layer and data lines formed in a second different signal layer may be alternatingly arranged one by one in the row direction X.

Referring to FIG. 13, the signal channel of the memory module 500 may generate the capacitive couplings CC1~CC6 in the vertical direction Z by overlapping of portions of the data lines 510, 520, 530, 540, 570, 580, 590 and 600. The couplings CC1~CC6 are described in more detail below with reference to FIGS. 15A, 15B and 15C.

Figure 15A:
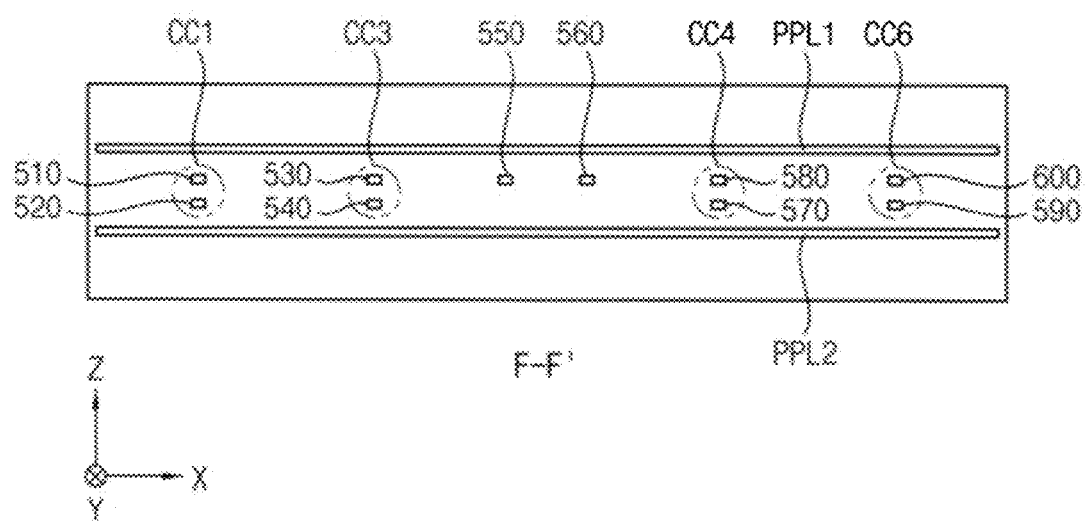
FIGS. 15A, 15B and 15C are cross-sectional views of the memory module of FIG. 13.
Figure 15B:
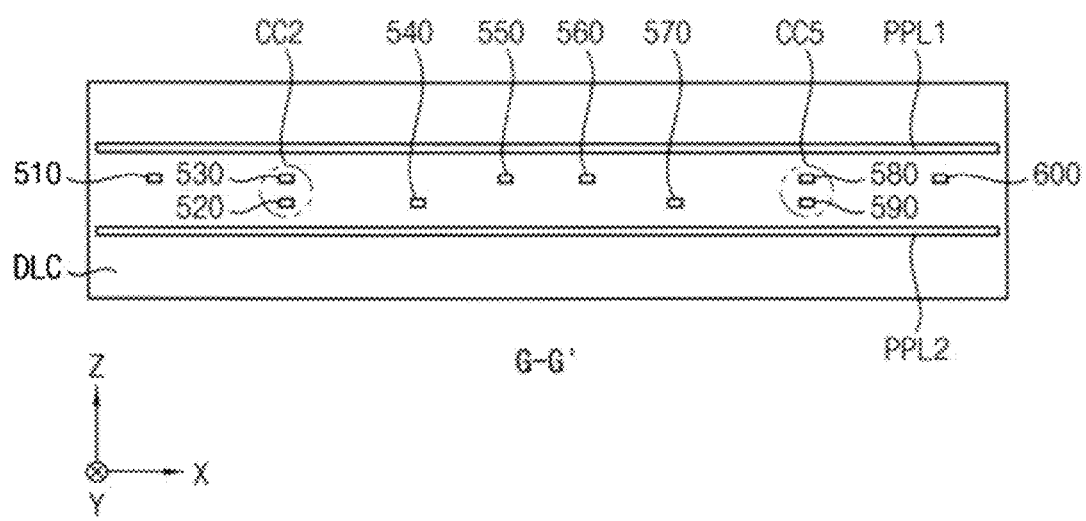
Figure 15C:
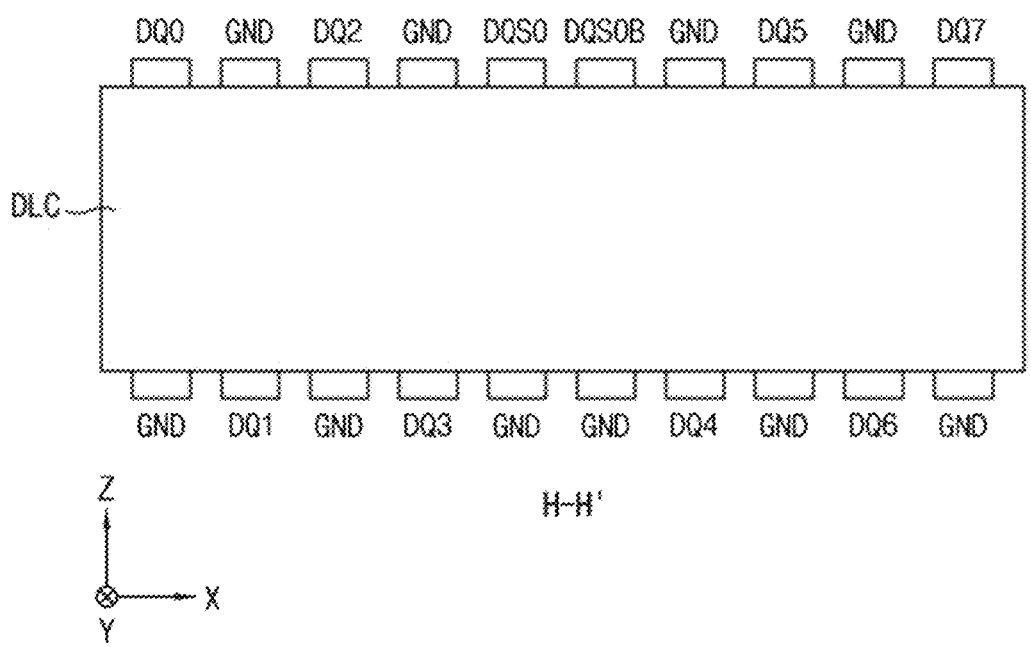

FIGS. 15A, 15B and 15C are cross-sectional views of the memory module of FIG. 13. FIG. 15A is a cross-sectional view along a line F-F' in FIG. 13, FIG. 15B is a cross-sectional view of the signal channel along a line G-G' in FIG. 13, and FIG. 15C is a cross-sectional view of the signal channel along a line H-H' in FIG. 13.

Referring to FIGS. 13 and 15A, along the cutting line F-F', the four capacitive couplings CC1, CC3, CC4 and CC6 may be formed between each pair of bytes, for example, between each of eight bits. For example, the neighboring data lines 510 and 520 may form the first capacitive coupling CC1, the neighboring data lines 530 and 540 may form the second capacitive coupling CC2, the neighboring data lines 570 and 580 may form the third capacitive coupling CC3, and the neighboring data lines 590 and 600 may form the fourth capacitive coupling CC4.

Referring to FIGS. 13 and 15B, along the cutting line G-G', the two capacitive couplings CC2 and CC5 may be formed between adjacent bytes. The neighboring data lines 520 and 530 may form the second capacitive coupling CC2 and the neighboring data lines 580 and 590 may form the fifth capacitive coupling CC5.

At least one data line of the data lines 510, 530, 570 and 590 may include two coupling segments forming two capacitive couplings with coupling segments of two data lines adjacent to the at least one data line at opposite sides in the row direction X. For example, the data line 530 may include the two coupling segments forming two capacitive couplings CC2 and CC3 with the coupling segments of the data lines 520 and 540 adjacent to the data line 530 at opposite sides in the row direction X.

Similarly, at least one data line of the data lines 520, 540, 580 and 600 may include two coupling segments forming two capacitive couplings with coupling segments of two data lines adjacent to the at least one data line at opposite sides in the row direction X. For example, the data line 520 may include the two coupling segments forming the two capacitive couplings CC1 and CC2 with the coupling segments of data lines 510 and 530 adjacent to the data line 520 at opposite sides in the row direction X.

Referring to FIGS. 13 and 15C, a plurality of taps corresponding to the data terminals DQ0~DQ7, the ground terminals GND, and data strobe terminals DQS0 and DQS0B may be formed at edge portions of the top and bottom surfaces of the substrate body formed of the dielectric DLC. The crosstalk noise may be reduced by disposing the ground terminals GND between the data terminals DQ0~DQ7.

Figure 16:
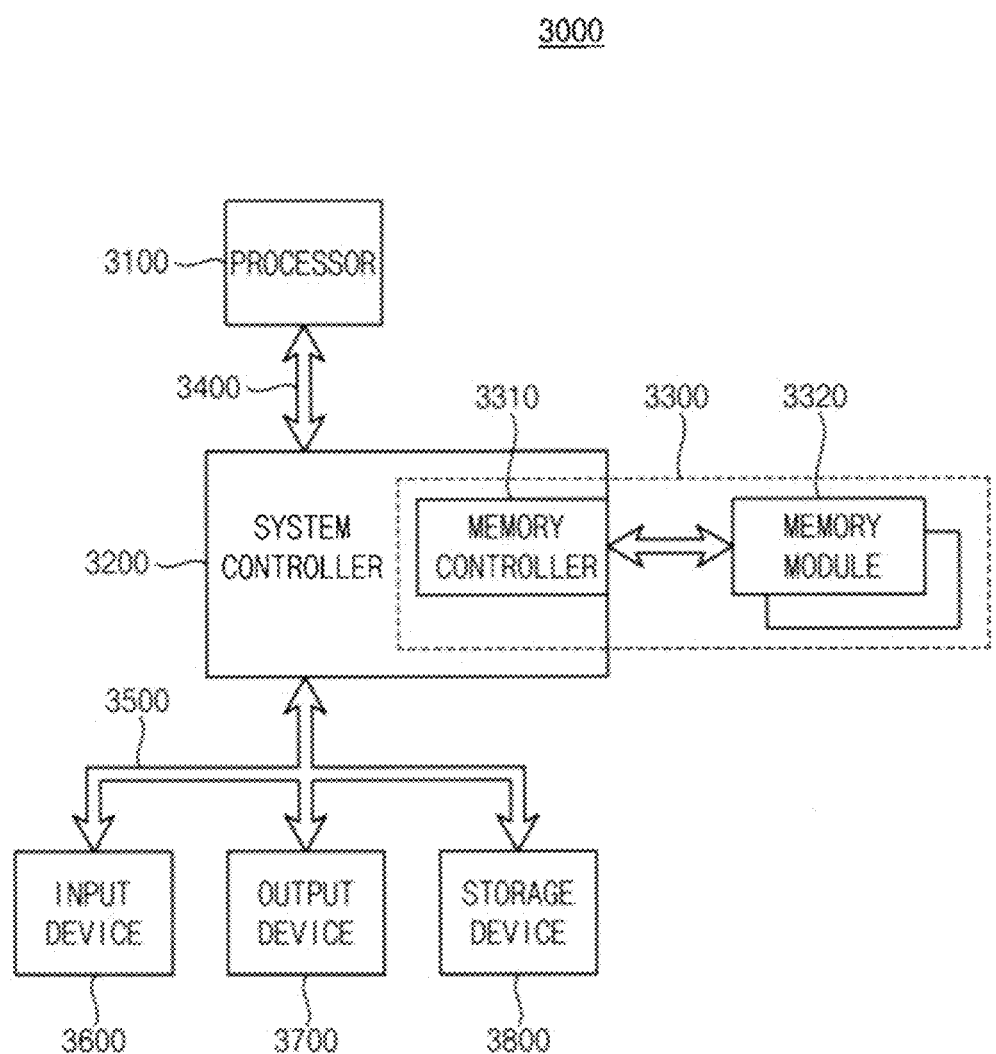
FIG. 16 is a block diagram illustrating a computing system according to an exemplary embodiment of the present inventive concept.

FIG. 16 is a block diagram illustrating a computing system according to an exemplary embodiment of the present inventive concept.

Referring to FIG. 16, a computing system 3000 includes a processor 3100, a system controller 3200 and a memory system 3300. The computing system 3000 may further include a processor bus 3400, an extension bus 3500, an input device 3600, an output device 3700, and a storage device 3800. The memory system 3300 may include at least one memory module 3320, and a memory controller 3310 for controlling the memory module 3320. The memory controller 3310 may be included in the system controller 3200.

The processor 3100 may perform various computing functions, such as executing specific software for performing specific calculations or tasks. The memory controller 3310 may control the memory module 3320 to perform a command provided form the processor 3100. The memory module 3320 may store data provided from the memory controller 3310, and may provide the stored data to the memory controller 3310. The memory system 3300 may include a signal channel generating a capacitive coupling in the vertical direction between signal lines according to an exemplary embodiment of the present inventive concept.

The signal channel and the module substrate according to an exemplary embodiment of the present inventive concept may reduce the crosstalk noise without increase of occupation area by generating capacitive coupling between signal lines in the vertical direction and may increase operation speeds of devices and systems including the signal channel and/or the module substrate.

Exemplary embodiments of the present inventive concept may be applied to desired devices and systems (e.g., an electronic system) including a signal channel. For example, the electronic system may be a system using the memory system, e.g., a desktop computer, a laptop computer, a tablet computer, a mobile phone, a smart phone, a music player, a PDA, a PMP, a digital television, a digital camera, or a portable game console.

While the present inventive concept has been particularly shown and described with reference to exemplary embodiments thereof, it will be understood by those of ordinary skill in the art that various changes in form and details may be made therein without departing from the spirit and scope of the present inventive concept.

What is claimed is:
1. A signal channel comprising:
at least one first signal line positioned in a first signal layer and at least one second signal line positioned in a second signal layer, wherein the first signal layer extends in a first horizontal plane, wherein the second signal layer extends along a second horizontal plane parallel to the first horizontal plane and spaced apart from the first horizontal plane along a vertical direction orthogonal to the first and second horizontal planes, wherein the first signal line includes a first coupling segment and the second signal line includes a second coupling segment, wherein the first coupling segment at least partially overlaps the second coupling segment along the vertical direction, and wherein the first and second coupling segments are positioned to form a greater degree of capacitive coupling between the first and second coupling segments than a degree of capacitive coupling formed between other segments of the first and second signal lines.

2. The signal channel of claim 1, wherein a mutual capacitance of the capacitive coupling between the first and second coupling segments is adjusted depending on a length of the first coupling segment, along the first horizontal plane, and a length of the second coupling segment, along the second horizontal plane.

3. The signal channel of claim 1, wherein a length of the first coupling segment along the first horizontal plane is substantially the same as a length of the second coupling segment along the second horizontal plane.

4. The signal channel of claim 1, further comprising:
a first reference plate positioned in a first voltage layer over the first signal layer; and
a second reference plate positioned in a second voltage layer below the second signal layer.

5. The signal channel of claim 4, wherein the first reference plate and the second reference plate each include a metal to which a reference voltage is applied, and a space between the first reference plate and the second reference plate is substantially filled with dielectric material.

6. The signal channel of claim 5, wherein the reference voltage applied to the first reference plate and the second reference plate is a ground voltage.

7. The signal channel of claim 5, wherein the first reference plate, the second reference plate and the first and second coupling segments forming the capacitive coupling form a dual strip line structure.

8. The signal channel of claim 1, wherein at least one signal line of the first and second signal lines includes two coupling segments forming two capacitive couplings with two coupling segments on opposite sides of the at least one signal line of the first and second signal lines.

9. The signal channel of claim 1, wherein a width of the first coupling segment is substantially the same as a width of the second coupling segment.

10. The signal channel of claim 1, wherein the first signal line includes:
first non-coupling segments extended in the first horizontal plane;
a first coupling segment extended in the first horizontal plane and positioned closer to the second signal line in comparison with the first non-coupling segments; and
first connecting segments connecting the first coupling segment to the first non-coupling segments.

11. The signal channel of claim 10, wherein the second signal line includes:
second non-coupling segments extended in the second horizontal plane;
a second coupling segment extended in the second horizontal plane and positioned closer to the first signal line in comparison with the second non-coupling segments; and
second connecting segments connecting the second coupling segment to the second non-coupling segments.

12. The signal channel of claim 11, wherein the first coupling segment and the second coupling segment are substantially completely overlapped with each other in the vertical direction to form the capacitive coupling.

13. The signal channel of claim 1, further comprising a third signal line formed in the first signal layer, the third signal line being adjacent to the second signal line at a side opposite to the first signal line in the first horizontal plane.

14. The signal channel of claim 13, wherein the second signal line includes:
non-coupling segments extended in the second horizontal plane;
a first coupling segment extended in the second horizontal plane and positioned closer to the first signal line in comparison with the non-coupling segments;
a second coupling segment extended in the second horizontal plane and positioned closer to the third signal line in comparison with the non-coupling segments; and
connecting segments connecting the first coupling segment and the second coupling segment to the non-coupling segments.

15. The signal channel of claim 14, wherein the first coupling segment of the second signal line and a coupling segment of the first signal line are positioned such that the first coupling segment of the second signal line and the coupling segment of the first signal line are overlapped with each other in the vertical direction to form the first capacitive coupling, and the second coupling segment of the second signal line and a coupling segment of the third signal line are positioned such that the second coupling segment of the second signal line and the coupling segment of the third signal line are overlapped with each other in the vertical direction to form the second capacitive coupling.

16. A signal channel comprising:
a plurality of signal lines, wherein each signal line of the plurality of signal lines is formed in a signal layer of a plurality of signal layers,
wherein the plurality of signal layers are spaced apart from each other in a vertical direction,
wherein each of the signal lines comprises a non-coupling segment, a connecting segment and a coupling segment,
wherein at least two coupling segments of two adjacent signal lines, respectively, overlap each other in the vertical direction, and
wherein the at least two coupling segments are positioned to form a greater degree of capacitive coupling between the at least two coupling segments than a degree of capacitive coupling formed between other segments of the signal lines.

* * * * *